United States Patent
Rudmann et al.

(10) Patent No.: US 9,094,593 B2
(45) Date of Patent: Jul. 28, 2015

(54) OPTOELECTRONIC MODULES THAT HAVE SHIELDING TO REDUCE LIGHT LEAKAGE OR STRAY LIGHT, AND FABRICATION METHODS FOR SUCH MODULES

(71) Applicant: Heptagon Micro Optics Pte. Ltd., Singapore (SG)

(72) Inventors: Hartmut Rudmann, Jona (CH); Simon Gubser, Adliswil (CH); Susanne Westenhöfer, Wettswil (CH); Stephan Heimgartner, Aarau Rohr (CH); Jens Geiger, Thalwil (CH); Xu Yi, Singapore (SG); Thng Chong Kim, Singapore (SG); John A. Vidallon, Singapore (SG); Ji Wang, Singapore (SG); Qi Chuan Yu, Singapore (SG); Kam Wah Leong, Singapore (SG)

(73) Assignee: Heptagon Micro Optics Pte. Ltd., Singapore (SG)

(*) Notice: Subject to any disclaimer, the term of this patent is extended or adjusted under 35 U.S.C. 154(b) by 0 days.

(21) Appl. No.: 14/339,623

(22) Filed: Jul. 24, 2014

(65) Prior Publication Data

US 2015/0036046 A1 Feb. 5, 2015

Related U.S. Application Data

(60) Provisional application No. 61/859,820, filed on Jul. 30, 2013.

(51) Int. Cl.
*H01L 21/00* (2006.01)
*H04N 5/225* (2006.01)
*H01L 25/00* (2006.01)

(52) U.S. Cl.
CPC .............. *H04N 5/2252* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 5,400,072 A | 3/1995 | Izumi et al. | |
| 2007/0126912 A1 | 6/2007 | De Bruin et al. | |
| 2009/0130791 A1 | 5/2009 | Kwon et al. | |
| 2009/0256931 A1* | 10/2009 | Lee et al. | 348/231.99 |
| 2010/0045845 A1 | 2/2010 | Yoneyama | |
| 2010/0073533 A1* | 3/2010 | Yano et al. | 348/294 |
| 2010/0073534 A1* | 3/2010 | Yano et al. | 348/294 |
| 2011/0050979 A1 | 3/2011 | Rudmann | |
| 2011/0051390 A1 | 3/2011 | Lin et al. | |
| 2012/0146170 A1 | 6/2012 | Vigier-Blanc et al. | |
| 2012/0307139 A1* | 12/2012 | Cheng et al. | 348/374 |
| 2013/0019461 A1 | 1/2013 | Rudmann et al. | |
| 2014/0183585 A1 | 7/2014 | Gubser et al. | |

* cited by examiner

*Primary Examiner* — Bilkis Jahan
(74) *Attorney, Agent, or Firm* — Fish & Richardson P.C.

(57) ABSTRACT

Optoelectronic modules include an optoelectronic device and a transparent cover. A non-transparent material is provided on the sidewalls of the transparent cover, which can help reduce light leakage from the sides of the transparent cover or can help reduce stray light from entering the module. The modules can be fabricated, for example, in wafer-level processes. In some implementations, openings such as trenches are formed in a transparent wafer. The trenches then can be filled with a non-transparent material using, for example, a vacuum injection tool. When a wafer-stack including the trench-filled transparent wafer subsequently is separated into individual modules, the result is that each module can include a transparent cover having sidewalls that are covered by the non-transparent material.

18 Claims, 25 Drawing Sheets

OPTOELECTRONIC MODULES THAT HAVE SHIELDING TO REDUCE LIGHT LEAKAGE OR STRAY LIGHT, AND FABRICATION METHODS FOR SUCH MODULES

FIELD OF THE DISCLOSURE

This disclosure relates to optoelectronic modules have shielding to reduce light leakage or stray light, and fabrication methods for such modules.

BACKGROUND

Smartphones and other devices sometimes include miniaturized optoelectronic modules such as light modules, sensors or cameras. Light modules can include a light emitting element such as a light emitting diode (LED), an infra-red (IR) LED, an organic LED (OLED), an infra-red (IR) laser or a vertical cavity surface emitting laser (VCSEL) that emits light through a lens to outside the device. Other modules can include a light detecting element. For example, CMOS and CCD image sensors can be used in primary or front facing cameras. Likewise, proximity sensors and ambient light sensors can include a light sensing element such as a photodiode. The light emitting and light detecting modules as well as cameras can be used in various combinations. Thus, for example, a light module such as a flash module can be used in combination with a camera that has an imaging sensor. Light emitting modules in combination with light detecting modules also can be used for other applications such as gesture recognition or IR illumination.

As illustrated in FIG. 1, one challenge when integrating an optoelectronic module 10 into a device such as a smartphone is how to reduce light leakage 14 from the light source 16 in the light module, or how to prevent incoming stray light from impinging, for example, in the case of sensors or cameras. Preferably, light emitted from light source 16 (or light to be detected by a sensor in the module) should pass through lens 12 and exit (or enter) directly through the transparent cover 18 of the module 10. However, in some cases, some of the light 14 exits (or enters) the sides of transparent cover 18, which can be undesirable.

SUMMARY

The present disclosure describes various optoelectronic modules that include an optoelectronic device (e.g., a light emitting or light detecting element) and a transparent cover. A non-transparent material is present on the sidewalls of the transparent cover, which, in some implementations, can help reduce light leakage from the sides of the transparent cover.

In addition, various techniques are described for fabricating the modules. In some implementations, the modules are fabricated in a wafer-scale process in which two or more wafers are attached to one another to form a wafer stack. Such processes allow many modules to be manufactured at the same time. In some implementations, various elements (e.g., an optical element such as a lens, an optical filter, or a focal length correction layer; or a spacer) can be formed directly on one side or both sides of the transparent wafer using one or more vacuum injection and/or replication tools. In some cases, an optical filter (e.g., a dielectric band-pass filter) and/or a focal length correction layer is present on a surface of the transparent wafer.

The transparent covers for the modules also can be fabricated as part of the wafer-level processes. For example, a structured transparent wafer (i.e., a wafer that has a non-flat or non-planar surface) can be provided by forming openings such as trenches in the transparent wafer. The trenches then can be filled with a non-transparent material using, for example, a vacuum injection tool. When the vertical-stack subsequently is separated into individual modules, the result is that each module can include a transparent cover having sidewalls that are covered by the non-transparent material.

For example, in one aspect, an optoelectronic module includes an optoelectronic device mounted on a substrate, and a transparent cover separated from the substrate by a spacer. The spacer is composed of a material that is non-transparent to light emitted by or detectable by the optoelectronic device. Sidewalls of the transparent cover are covered by a material that is non-transparent to light emitted by or detectable by the optoelectronic device.

Some implementations include one or more of the following features. For example, the module also can include an optical element such as a lens, an optical filter and/or a focal length correction layer on a surface of the transparent cover. The non-transparent material covering the sidewalls of the transparent cover can be, for example, the same material of which the spacer is composed. In some cases, the non-transparent material covering the sidewalls of the transparent cover is a polymer material (e.g., epoxy, acrylate, polyurethane, or silicone) containing a non-transparent filler (e.g., carbon black, pigment, or dye). The optical element can be located in an interior area (i.e., on the sensor-side) of the module or disposed on an exterior surface (i.e., the object-side) of the transparent cover. Some implementations may include multiple optical elements (e.g., an optical element in an interior area of the module and an optical element disposed on an exterior surface of the transparent cover). The module also can include a baffle extending beyond a surface of the transparent cover. The baffle can be composed, in some implementations, of the same non-transparent material that covers the sidewalls of the transparent cover.

Another aspect describes methods of fabricating optoelectronic modules each of which includes at least one optoelectronic device and at least one optical element such as lens, an optical filter or a focal length correction layer. The methods can include providing a transparent wafer having first and second surfaces on opposite sides of the transparent wafer, wherein there are a plurality of non-transparent spacer elements on one of the surfaces of the transparent wafer. Openings (e.g., trenches) are formed in the transparent wafer. Each opening is disposed over a respective one of the spacer elements and extends through the transparent wafer. The openings in the transparent wafer substantially filled with a material that is non-transparent to light emitted by or detectable by the optoelectronic devices. The methods allow modules to be fabricated such that sidewalls of the transparent cover are covered by a non-transparent material.

In yet a further aspect, some modules (e.g., camera modules) can include a vertical stack of two or more transparent substrates, each of which includes optical elements (e.g., lenses) on one or both sides. Such modules can include an image sensor and a vertically stacked transparent substrates separated from one another by a spacer. Each of the transparent substrates has an optical element on at least one of its surfaces. The stacked transparent substrates are attached to the image sensor, which is composed of a material that is non-transparent to light detectable by the image sensor. Sidewalls of the transparent substrates also are covered by a material that is non-transparent to light detectable by the image sensor.

In a further aspect, an optoelectronic module includes an image sensor on a substrate. The image sensor defines a plurality of photosensitive regions each of which corresponds to a respective optical channel. The module also includes a transparent cover, in each optical channel, separated from the substrate by a spacer. The spacer is composed of a material that is non-transparent to light detectable by the image sensor. A focal length correction layer is on a surface of the transparent cover of at least one of the optical channels. Sidewalls of the transparent cover are covered by a material that is non-transparent to light emitted by or detectable by the optoelectronic device. In some implementations, the module also may include an optical filter on a surface of the transparent cover of each optical channel.

In some instances, a module may include an optics assembly on the object-side of the transparent cover. The optics assembly can include, for example, one or more lenses (e.g., a vertical stack of injection molded lenses).

Other aspects, features and advantages will be readily apparent from the following detailed description, the accompanying drawings and the claims.

DETAILED DESCRIPTION

Figure 1:
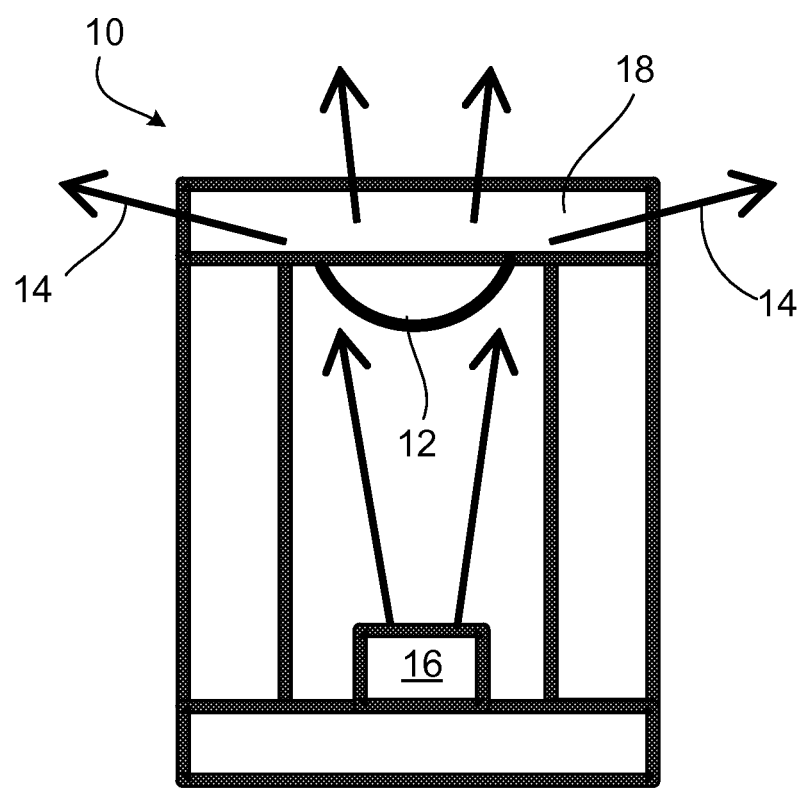
FIG. 1 shows an example of an optoelectronic module.
Figure 2A:
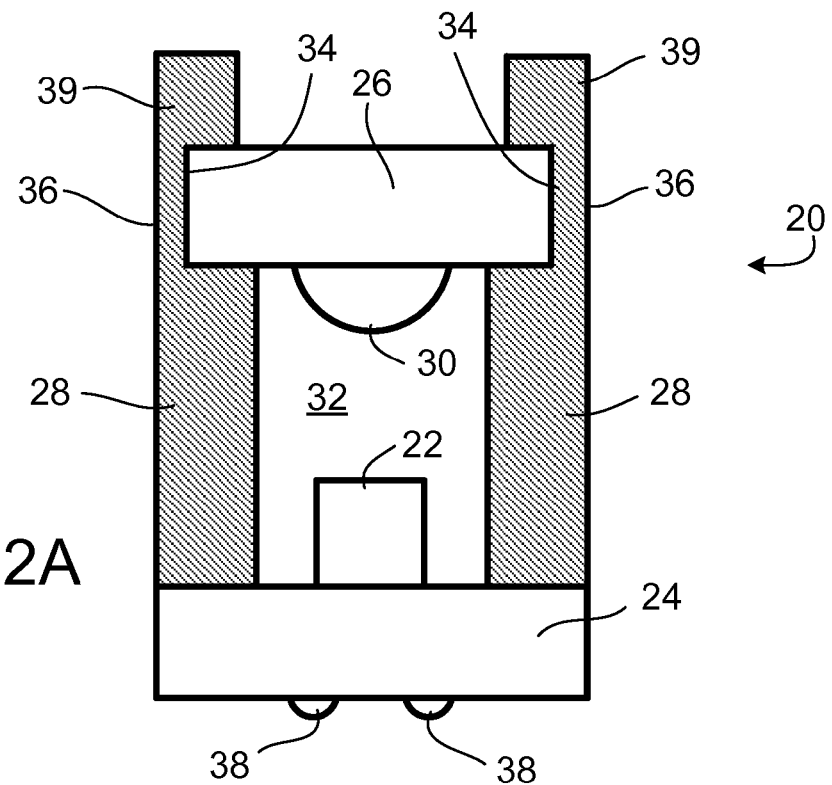
FIGS. 2A and 2B are examples of optoelectronic modules according to the invention.

The present disclosure describes various techniques for fabricating optoelectronic modules that include non-transparent material (e.g., a polymer such as epoxy with carbon black) on the exterior sidewalls of the transparent cover. An example of such a module is illustrated in FIG. 2A, which shows a module 20 including an optoelectronic device 22 mounted on a printed circuit board (PCB) or other substrate 24. Examples of the optoelectronic device 22 include a light emitting element (e.g a LED, an IR LED, an OLED, an IR laser or a VCSEL) or a light detecting element (e.g., a photodiode or other light sensor).

A transparent cover 26 composed, for example, of glass, sapphire or a polymer material, is separated from substrate 24 by a spacer 28. Spacer 28 surrounds optoelectronic device 22 and serves as sidewalls for the module. Transparent cover 26 generally is transparent to wavelengths of light emitted or detectable by optoelectronic device 22. Spacer 28 preferably is composed of a non-transparent material, such as epoxy with carbon black. Attached to one side of transparent cover 26 is an optical element such as a lens or diffuser 30. In the illustrated example of FIG. 2A, the optical element 30 is formed by a replication technique and, together with optoelectronic device 22, is present in an interior area 32 of module 20. Exterior sidewalls 34 of transparent cover 26 also are covered by a non-transparent material 36, which may be composed of the same or a different material as is used for spacer 28. The exterior side of substrate 24 includes one or more solder balls or other conductive contacts 38, which can be coupled electrically to optoelectronic device 22 by way of conductive vias extending through substrate 24.

In some cases, non-transparent material 39 extends beyond the top of transparent cover 26 near its edges. The non-transparent material 39 that extends above transparent cover 26 can serve as a baffle for the module. Depending on the implementation, the non-transparent material 36 that covers the sidewalls 34 of the transparent cover 26 can be the same as, or different from, the material of the spacer 28. Likewise, the baffle may be composed of the same material as, or a different material from, the non-transparent material 36 that covers the sidewalls 34 of the transparent cover 26.

Figure 2B:
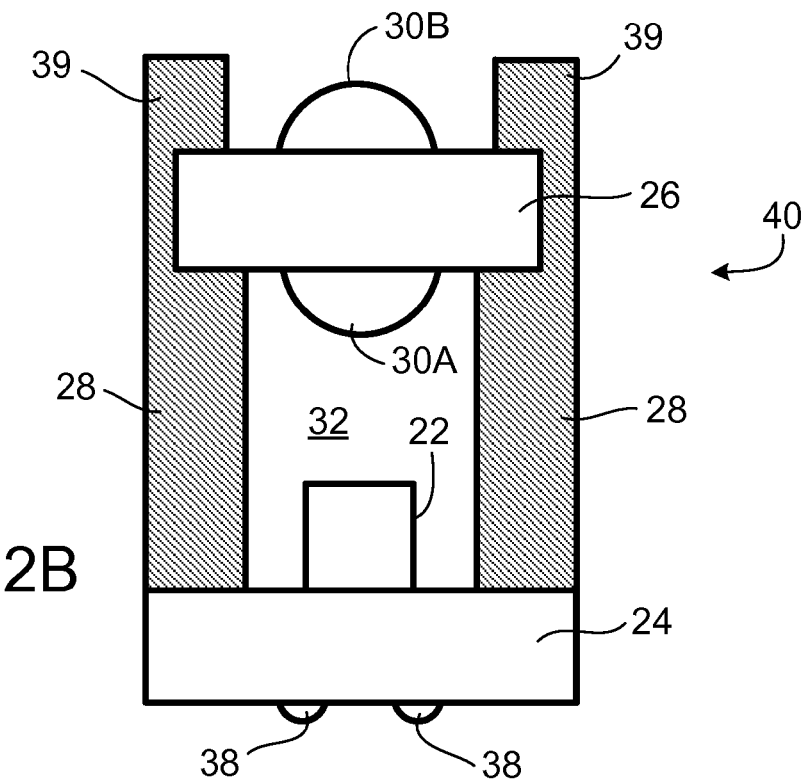

In some implementations, an optical element is disposed on the exterior surface of transparent cover 26. For example, module 40 of FIG. 2B is similar to module 20 of FIG. 2A, except that in FIG. 2B there are a pair of optical elements 30A, 30B. The second optical element 30B is disposed on the exterior surface of transparent cover 26, whereas the first optical element 30A is disposed on the interior surface of transparent cover 26. Some implementations may include an optical element only on the exterior surface of transparent cover 26. Other features of module 40 can be similar to the features discussed above with respect to FIG. 2A.

The following paragraphs describe various fabrication techniques for manufacturing the foregoing optoelectronic modules and other similar modules that include a light emitting element or light detecting element and an optical element such as a lens or diffuser integrated as part of the module. Some modules can include multiple optoelectronic devices (e.g., a light emitting element and a light detecting element). In this way, proximity-type sensor modules, for example, having a light emitter and a light detector can be fabricated. In some implementations, the light emitter and light detector are separated by a spacer made of non-transparent material. In some implementations, the modules are fabricated in a wafer-scale process so that multiple modules (e.g., hundreds or even thousands) can be manufactured at that same time. The methods can include using a vacuum injection technique to form various elements on a structured substrate (i.e., a substrate that has a non-flat or non-planar surface). Forming the structured substrate can include, for example, forming openings such as trenches in a transparent wafer. The trenches then can be filled with a non-transparent material using, for example, a vacuum injection tool. Various elements (e.g., the optical elements or spacers) can be formed directly on one side or both sides of the transparent wafer using one or more vacuum injection and/or replication tools.

Figure 3:
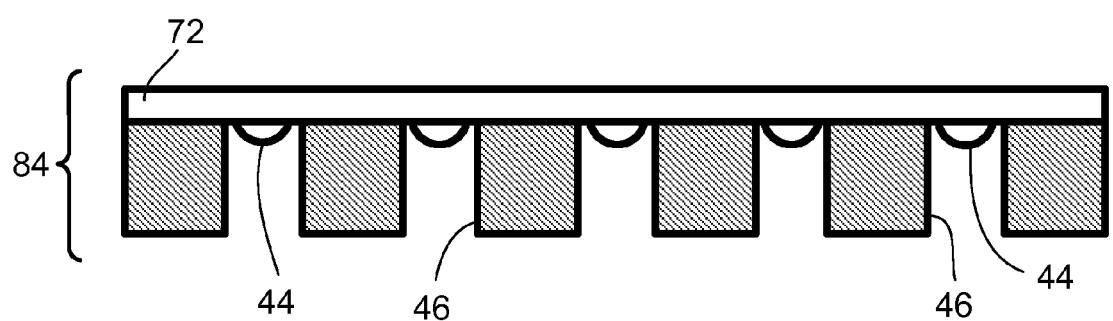
FIG. 3 illustrates an example of a spacer/optics structure.

For example, in some implementations, a wafer-scale spacer/optics structure 84 is provided and includes replicated optical elements 44 and spacers 46 on a transparent wafer 72 (see FIG. 3). Wafer 72 can be composed, for example, of a transparent material such as glass or a transparent plastic or polymer material. The spacer/optics structure 84 can be fabricated in any one of several ways. For example, in a first technique, a single tool can be used to form replicated lenses or other optical elements 44 on a surface of the transparent wafer 72 and to form the spacers 46 using vacuum injection. As used in this disclosure, replication refers to a technique in which a structured surface is embossed into a liquid, viscous or plastically deformable material, and then the material is hardened, e.g., by curing using ultraviolet radiation or heating. In this way, a replica of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state. Although the replication material used to form lenses 44 is transparent (at least to wavelengths of light that are to be emitted from or detected by the module), the vacuum injection material for the spacers preferably is non-transparent and can be composed, for example, of epoxy with carbon black. Further details that may be applicable to the foregoing process in some implementations are described in U.S. Provisional Patent Application No. 61/746,347, the contents of which are incorporated herein by reference. In a second technique, instead of forming the spacers 46 using a vacuum injection technique, a spacer/optics structure 84 can be formed using a wafer stacking process (i.e., attaching a spacer wafer to an optics wafer that includes the previously formed optical elements on its surface).

Figure 4A:
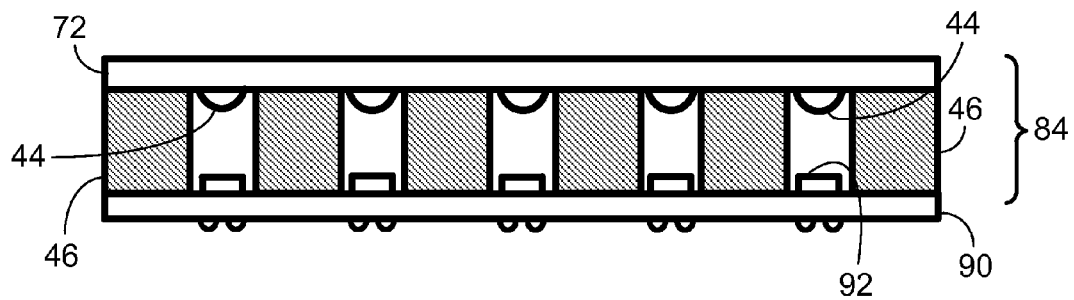
FIGS. 4A-4E illustrate steps in a wafer-level fabrication process for using the structure of FIG. 3 to make optoelectronic modules.

The spacer/optics structure 84 of FIG. 3 can be used, for example, to form modules such as those illustrated in FIGS. 2A and 2B. For example, FIGS. 4A-4E illustrates further steps for fabricating the module 20 of FIG. 2A. As shown in FIG. 4A, the spacer/optics structure 84 is attached to a printed circuit board (PCB) or other substrate 90 on which are mounted multiple optoelectronic devices 92. Alternatively, the spacer/optics structure 84 may be attached to a transient substrate(s) instead of substrate 90 to impart, for example, mechanical support to spacer/optics structure 84. Examples of transient substrates include UV dicing tape, a PDMS substrate, a glass substrate, a polymer wafer, and/or the tool(s) used to form the replicated optical elements 44 and/or spacers 46, or a combination of any of the foregoing examples. Use of a transient substrate allows the PCB substrate 90 to be attached to the spacer optics structure 84 later in the process (e.g., after performance of the step(s) in FIG. 4C). In some implementations, image sensors can be attached or electrically connected to the PCB substrate 90, and then can be attached to the spacer optics structure 84 later in the process (e.g., after performance of the step(s) in FIG. 4E). The PCB substrate 90 is attached, for example, using a thermally stable adhesive, to spacer elements 46 on the spacer/optics structure 84. The result is a wafer stack that includes an array of optoelectronic devices 92 each of which is aligned with a respective one of the optical elements (e.g., lenses) 44. The exterior surface of the substrate can include one or more solder balls or other conductive contacts, which can be coupled electrically to the optoelectronic devices by way of conductive vias extending through the substrate.

Figure 4B:
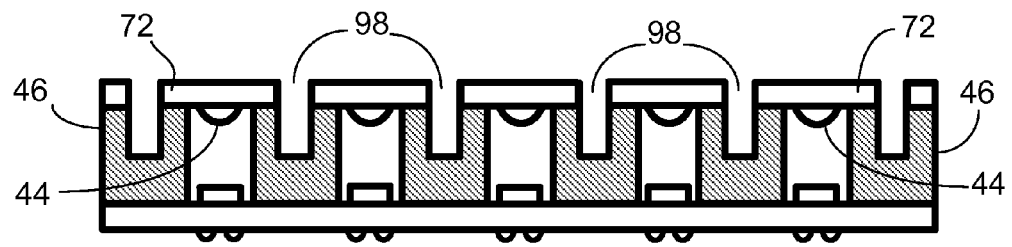

As shown in FIG. 4B, openings (e.g., trenches) 98 are formed in the transparent wafer 72 in regions above spacers 46. Trenches 98 should extend entirely through the thickness of wafer 72 and, preferably, should extend partially into spacers 46. Trenches 98 can be formed, for example, by dicing, micromachining or laser cutting techniques. The result is a non-planar surface that includes trenches 98 formed between adjacent portions of transparent wafer 72. As explained below, trenches 98 subsequently are filled with a non-transparent material (e.g., epoxy with carbon black) so as to provide a non-transparent layer on the sidewalls of the various portions of the transparent wafer 72.

Figure 4C:
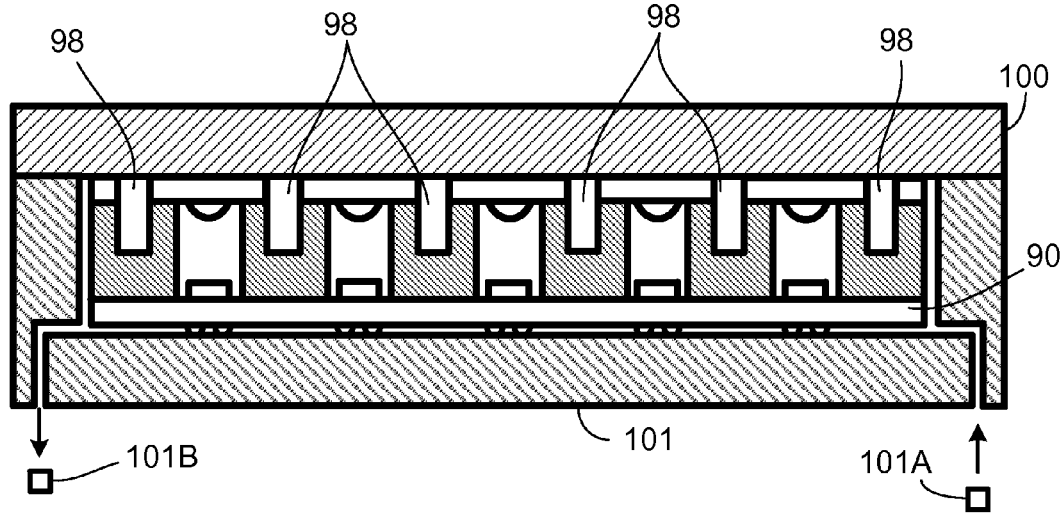
Figure 4D:
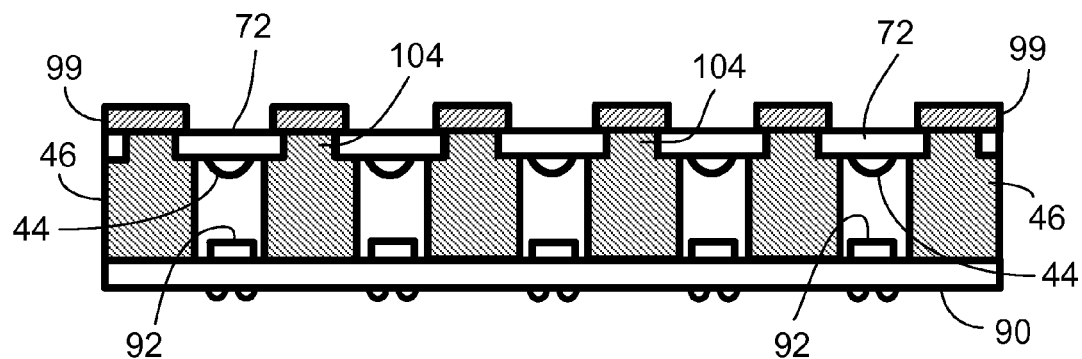

As shown in FIG. 4C, a vacuum injection PDMS tool 100 is placed over transparent wafer 72 to facilitate filling trenches 98 with a non-transparent material (e.g., epoxy with carbon black). A vacuum chuck 101 is provided below and around the spacer/optics structure 84 so as to apply a vacuum between the vacuum injection tool 100 and the PCB substrate 90. The non-transparent material can be injected into an inlet 101A in the vacuum chuck 101. A vacuum pump 101B near an outlet of the vacuum chuck 101 facilitates flow of the injected non-transparent material. After filling trenches 98 with the epoxy material under vacuum, the epoxy material is hardened (e.g., by UV or thermal curing), and the tool 100 is removed from the spacer/optics structure 84. The result, as shown in FIG. 4D, is that non-transparent regions 104 (e.g., epoxy with carbon black) are formed between adjacent portions of the transparent wafer 72. Each non-transparent region 104 is in contact with, and bonds to, a non-transparent spacer 46. Non-transparent regions 104 are flush with the exterior surface of the various portions of the transparent wafer 72 and can be composed of the same non-transparent material or a different non-transparent material as spacers 46. In some implementations, a baffle wafer 99 composed of a non-transparent material is attached over the spacer/optics structure. In other implementations, the baffle wafer 99 can be omitted.

Figure 4E:
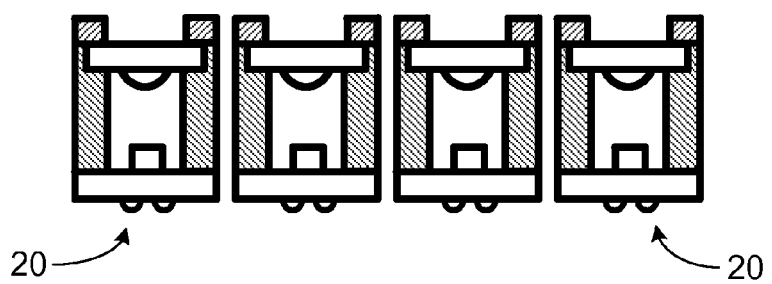

After forming the epoxy with carbon black regions 104 and removing the vacuum injection tool 100, the wafer stack is separated along dicing lines to form individual optoelectronic modules 20 each of which includes an optoelectronic device aligned with a lens element attached to a transparent cover, whose exterior sidewalls are covered with, or embedded within, non-transparent material (see FIGS. 4E and 2A). Thus, the foregoing technique can be used to fabricate multiple modules 20 on a wafer-level scale.

In the illustrated example of FIGS. 4A-4E, the PCB substrate 90 (with the optoelectronic devices mounted on its surface) is attached to the spacer/optics structure 84 before performance of the steps in FIGS. 4B-4E. In other implementations, the spacer/optics structure 84 may be attached to a transient substrate instead of substrate 90 to impart, for example, mechanical support to spacer/optics structure 84. Examples of transient substrates include UV dicing tape, a PDMS substrate, a glass substrate, a polymer wafer, and/or the tool(s) used to form the replicated optical elements 44 and/or the spacers 46, or a combination of any of the foregoing examples. Use of a transient substrate allows the PCB substrate 90 to be attached to the spacer/optics structure 84 later in the process (e.g., after performance of the step(s) in FIG. 4C). In other implementations, image sensors may be attached or electrically connected to the PCB substrate 90, and then attached to a singulated spacer optics structure 84 later in the process (e.g., after performance of the step(s) in FIG. 4E). Furthermore, in some implementations, instead of attaching a PCB substrate (with the optoelectronic devices mounted on its surface) to the spacer/optics structure 84, individual singulated optoelectronic devices can be attached to the spacer elements 46.

Figure 5A:
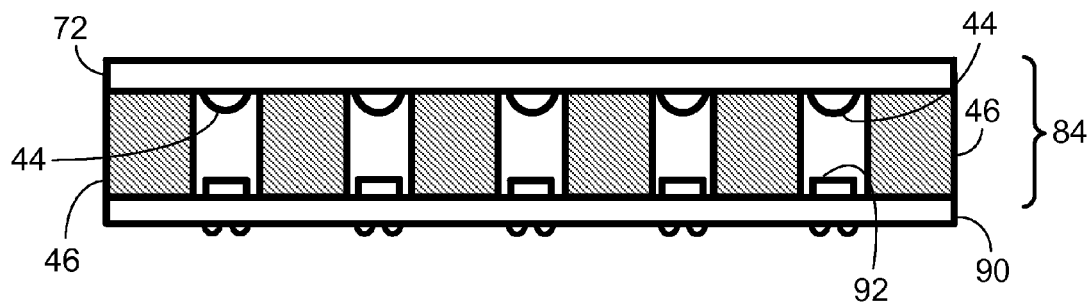
FIGS. 5A-5E illustrate steps in another wafer-level fabrication process for using the structure of FIG. 3 to make optoelectronic modules.
Figure 5B:
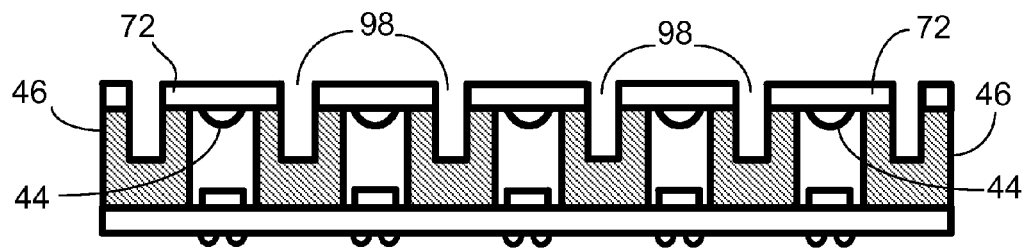

FIGS. 5A-5E illustrate steps according to another method for fabricating modules 20 as shown in FIG. 2A. In this example, as described in greater detail below, the non-transparent baffles 39 are formed by vacuum injection at the same time as the non-transparent material 36 for the sidewalls 34 of the transparent cover 26. As shown in FIG. 5A, the spacer/optics structure 84 of FIG. 3 is attached to a printed circuit board (PCB) or other substrate 90 on which are mounted multiple optoelectronic devices 92. Details of FIG. 5A can be similar to FIG. 4A. As shown in FIG. 5B, openings such as trenches 98 are formed in the transparent wafer 72. Details of FIG. 5B can be similar to FIG. 4B.

Figure 5C:
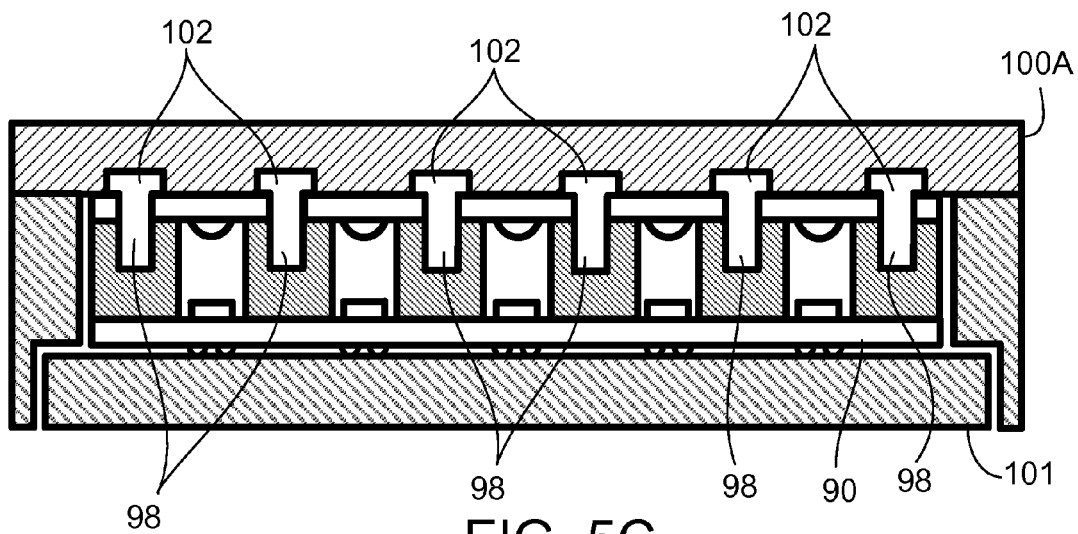
Figure 5D:
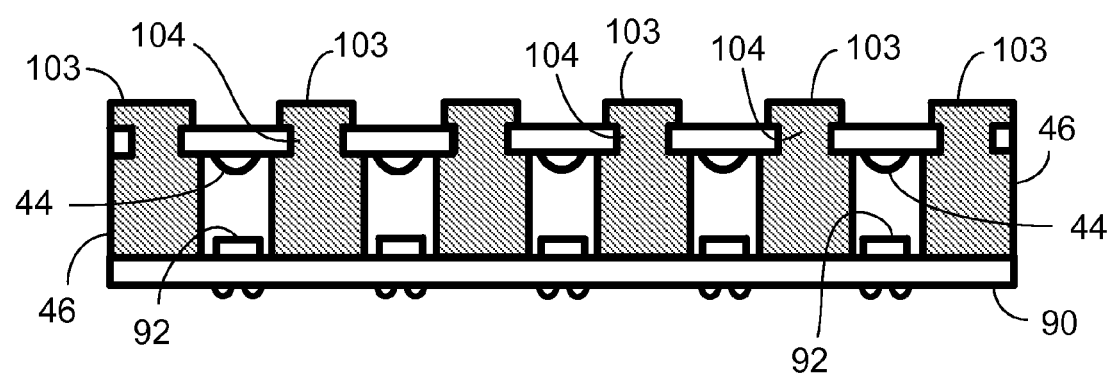

Next, as shown in FIG. 5C, a vacuum injection PDMS tool 100A is placed over transparent wafer 72 to facilitate filling trenches 98 with a non-transparent material (e.g., epoxy with carbon black). A vacuum chuck 101 is provided below and around the spacer/optics structure 84 so as to apply a vacuum between the vacuum injection tool 100A and the PCB substrate 90. In the illustrated example, vacuum injection tool 100A has openings 102 that are positioned above trenches 98. Non-transparent material (e.g., epoxy with carbon black) is injected under vacuum through an inlet in the vacuum chuck 101 so that it fills the openings 102 and the trenches 98. As described above in connection with FIG. 4C, a vacuum pump near an outlet of the vacuum chuck 101 facilitates flow of the injected epoxy material. The epoxy material subsequently is hardened (e.g., by UV or thermal curing), and the tool 100A is removed from the wafer stack. The result, as shown in FIG. 5D, is that non-transparent regions 104 (e.g., epoxy with carbon black) are formed between adjacent portions of the transparent wafer 72. In addition, the non-transparent material (e.g., epoxy with carbon black) extends partially over the top surfaces of the various sections of the transparent wafer 72 to form projections 103. Each non-transparent region 104 is in contact with, and bonds to, a non-transparent spacer 46. As in the previous example, non-transparent regions 103, 104 can be composed of the same non-transparent material or a different non-transparent material as spacers 46. This technique allows the projections 103 (which serve as baffles in the finished modules) to be formed in the same processing step in which the sidewalls of the various portions of transparent wafer 72 are covered by non-transparent material 104.

Figure 5E:
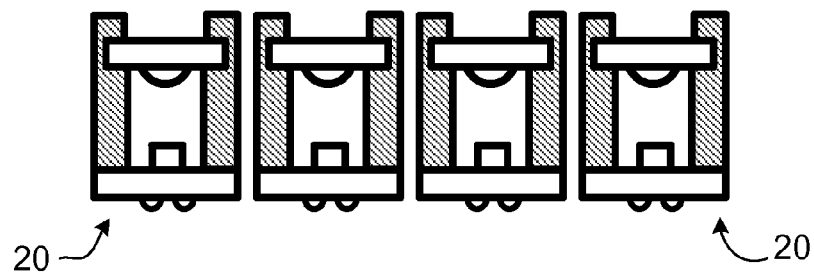

Next, the wafer stack is separated along dicing lines to form individual optoelectronic modules 20 each of which includes an optoelectronic device aligned with an optical element attached to a transparent cover, whose exterior sidewalls are covered with, or embedded within, non-transparent material (see FIGS. 5E and 2A). Each module 20 also includes a non-transparent baffle (i.e., baffle 39 in FIG. 2A) that extends above the outer surface of the transparent cover. Thus, the foregoing technique can be used to fabricate multiple modules 20 on a wafer-level scale.

In the illustrated example of FIGS. 5A-5E, the PCB substrate 90 (with the optoelectronic devices mounted on its surface) is attached to the spacer/optics structure 84 before performance of the steps in FIGS. 5B-5E. In other implementations, the PCB substrate 90 can be attached to the spacer/optics structure 84 later in the process (e.g., after performance of the steps in FIG. 5C). Furthermore, in some implementations, instead of attaching a PCB substrate (with the optoelectronic devices mounted on its surface) to the spacer/optics structure 84, individual singulated optoelectronic devices can be attached to the spacer elements 46.

In the foregoing techniques of FIGS. 4A-4E and 5A-5E, the replicated optical elements 44 (e.g., lens elements) are formed on the same surface of the transparent wafer 72 as the spacers 46. Such techniques result in modules such as the one in FIG. 2A in which the lens 30 as well as the optoelectronic device 22 are disposed within an enclosed, interior region of the module defined by the substrate 24, the transparent cover 26 and the spacer 28. Other techniques can be used to fabricate modules, such as the one in FIG. 2B, in which an optical element (e.g., lens) is disposed on an exterior surface of the transparent cover 26. An example of a wafer-level fabrication process for making modules that include optical elements on both surfaces (i.e., object side and sensor side) of the transparent cover 26 is now described in connection with FIGS. 6A through 6E.

Figure 6A:
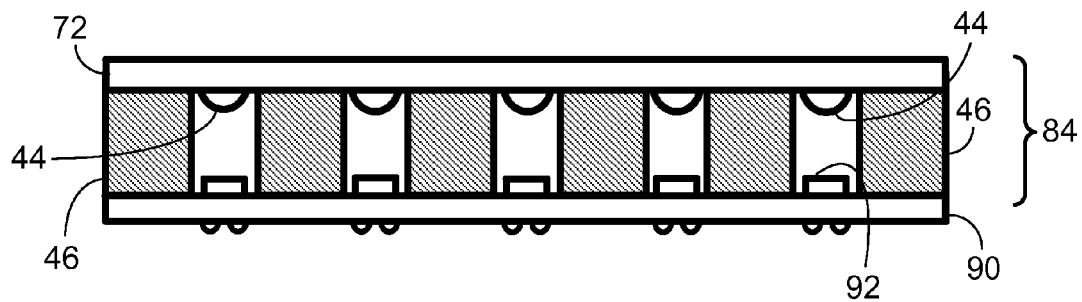
FIGS. 6A-6E illustrate steps in a further wafer-level fabrication process for using the structure of FIG. 3 to make optoelectronic modules.
Figure 6B:
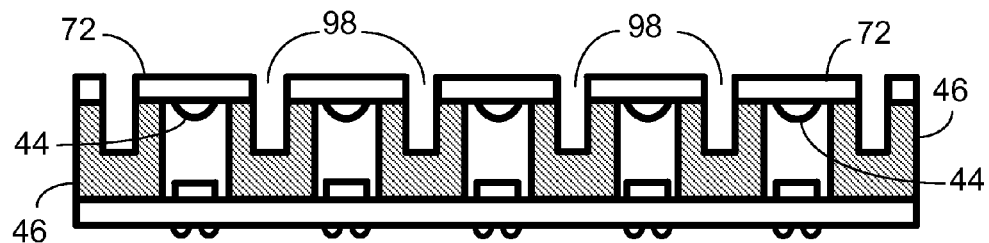

As shown in FIG. 6A, the spacer/optics structure 84 of FIG. 3 is attached to a printed circuit board (PCB) or other substrate 90 on which are mounted multiple optoelectronic devices 92. Details of FIG. 6A can be similar to FIG. 4A. As shown in FIG. 6B, openings such as trenches 98 are formed in the transparent wafer 72 above the spacers 46. Details of FIG. 6B can be similar to FIG. 4B.

Figure 6C:
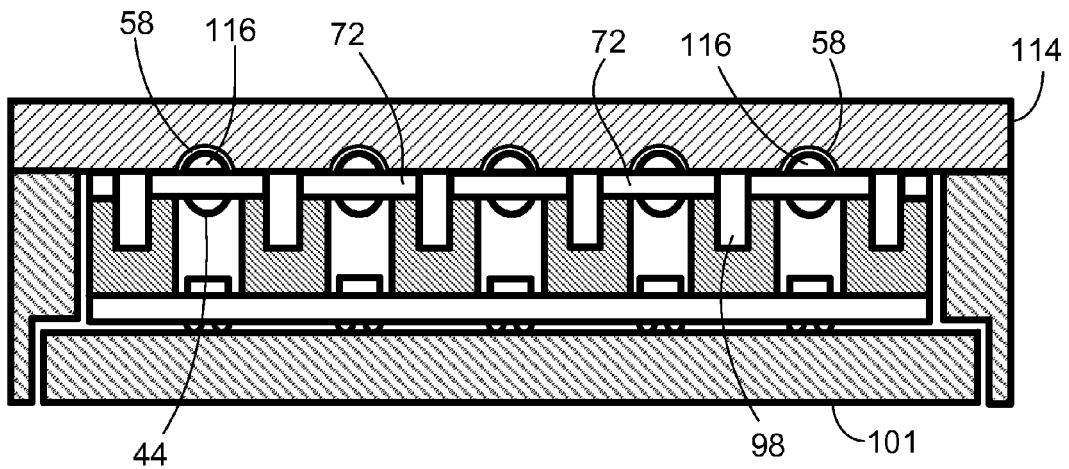

Next, as shown in FIG. 6C, a combined vacuum injection and replication tool 114 is placed over the spacer/optics structure 84, and a vacuum chuck 101 is provided below and around the spacer/optics structure 84 so as to apply a vacuum between the vacuum injection tool 114 and the PCB substrate 90. In particular, vacuum injection and replication tool 114 is placed over transparent wafer 72 to facilitate the formation of optical elements (e.g., lenses) 116, as well as the filling of trenches 98 with a non-transparent material (e.g., epoxy with carbon black). Vacuum injection and replication tool 114 has optical element replication sections 58. A replication material (e.g., a liquid, viscous or plastically deformable material) is placed onto the optical replication sections 58, and transparent wafer 72 is brought into contact with the replication tool 114 so that the replication material is pressed between a surface of the wafer and the optical replication sections 58. The replication material then is hardened (e.g., by UV or thermal curing) to form replicated optical elements 116 (e.g., lenses) on the outer surface of the transparent wafer 72 (see FIG. 6B).

Figure 6D:
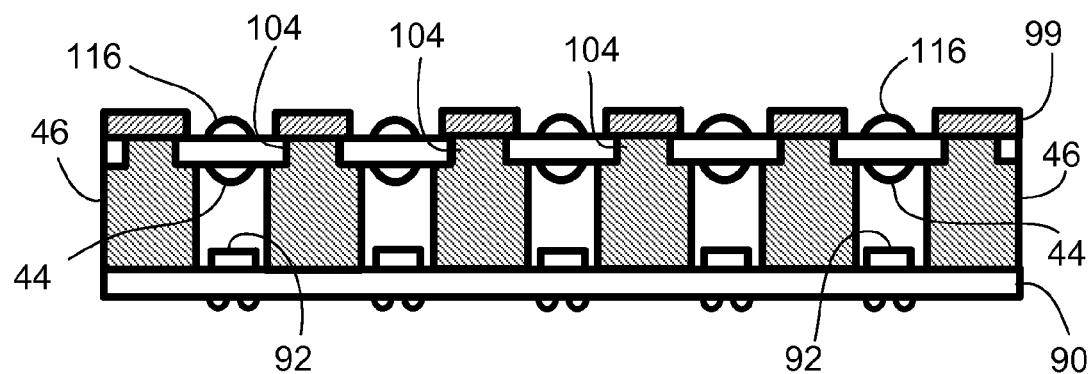

In addition to formation of the replicated lenses 116, non-transparent material (e.g., epoxy with carbon black) is injected through an inlet in the tool 114 so as to fill the trenches 98. As described above in connection with FIG. 4C, a vacuum pump near an outlet of the vacuum chuck 101 facilitates flow of the injected non-transparent material. The epoxy material subsequently is hardened (e.g., by UV or thermal curing), and the tool 114 is removed from the wafer stack. The result, as shown in FIG. 6D, is that non-transparent regions 104 are formed between adjacent portions of the transparent wafer 72. Non-transparent regions 104 are flush with the exterior surface of the various portions of the transparent wafer 72 and can be composed of the same non-transparent material or a different non-transparent material as spacers 46. Each non-transparent region 104 is in contact with, and bonds to, a non-transparent spacer 46. If desired, a baffle wafer 99 can be attached over the structure 84 of FIG. 4C to provide baffles for the modules. If provided, the baffle wafer can be attached to the spacer/optics structure 84 on the side opposite the spacers 46. In other implementations, the baffle wafer 99 can be omitted.

Figure 6E:
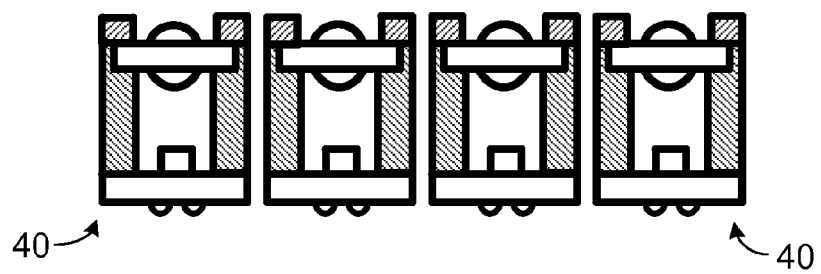

Next, the wafer stack is separated along dicing lines to form individual optoelectronic modules 40 each of which includes an optoelectronic device aligned with a pair of optical elements attached to a transparent cover, whose exterior sidewalls are covered with, or embedded within, non-transparent material (see FIGS. 6E and 2B). Thus, the foregoing technique can be used to fabricate multiple modules 40 on a wafer-level scale.

In the illustrated example of FIGS. 6A-6E, the PCB substrate 90 (with the optoelectronic devices mounted on its surface) is attached to the spacer/optics structure 84 before performance of the steps in FIGS. 6B-6E. In other implementations, the PCB substrate can be attached to the spacer/optics structure 84 later in the process (e.g., after performance of the steps in FIG. 6C). Furthermore, in some implementations, instead of attaching a PCB substrate 90 (with the optoelectronic devices mounted on its surface) to the spacer/optics structure 84, individual singulated optoelectronic devices can be attached to the spacers 46.

Although the example of FIGS. 6A-6E results in modules that have optical elements (e.g., lenses) on both surfaces of the transparent cover, it is possible to omit the optical elements that are on the same surface of the transparent cover as the spacers 46. In that case, each module would include only a lens or other optical element on its object-side, but not on the sensor-side of the module. To fabricate such modules, the replicated optical elements 44 could be omitted from the structure 84 of FIG. 3 before performing the subsequent steps described in connection with FIGS. 6A-6D.

Figure 7A:
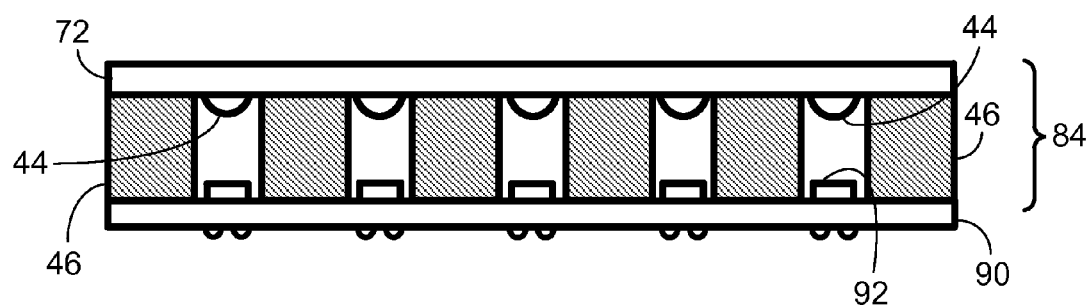
FIGS. 7A-7E illustrate steps in another wafer-level fabrication process for using the structure of FIG. 3 to make optoelectronic modules.
Figure 7B:
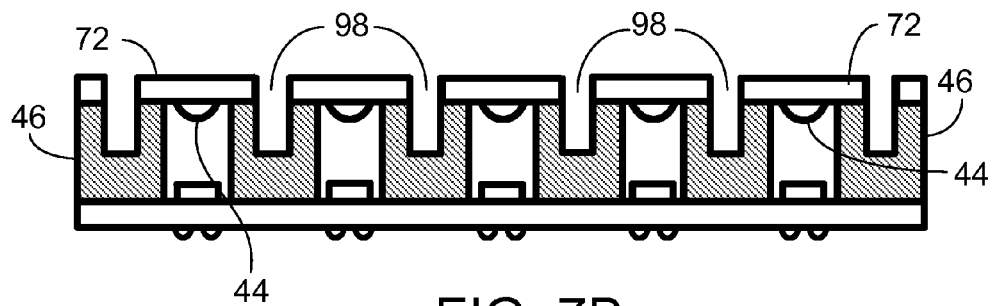

FIGS. 7A-7E illustrate steps according to another method for fabricating modules 40 as shown in FIG. 2B, which include an optical element (e.g., lens) on the outer surface of transparent cover 26 and in which portions 39 of non-transparent material 36 extend above transparent cover 26 and can serve as a baffle. As shown in FIG. 7A, the spacer/optics structure 84 of FIG. 3 is attached to a printed circuit board (PCB) or other substrate 90 on which are mounted multiple optoelectronic devices 92. Details of FIG. 7A can be similar to FIG. 4A. As shown in FIG. 7B, openings such as trenches 98 are formed in the transparent wafer 72 above the spacers 46. Details of FIG. 7B can be similar to FIG. 4B.

Figure 7C:
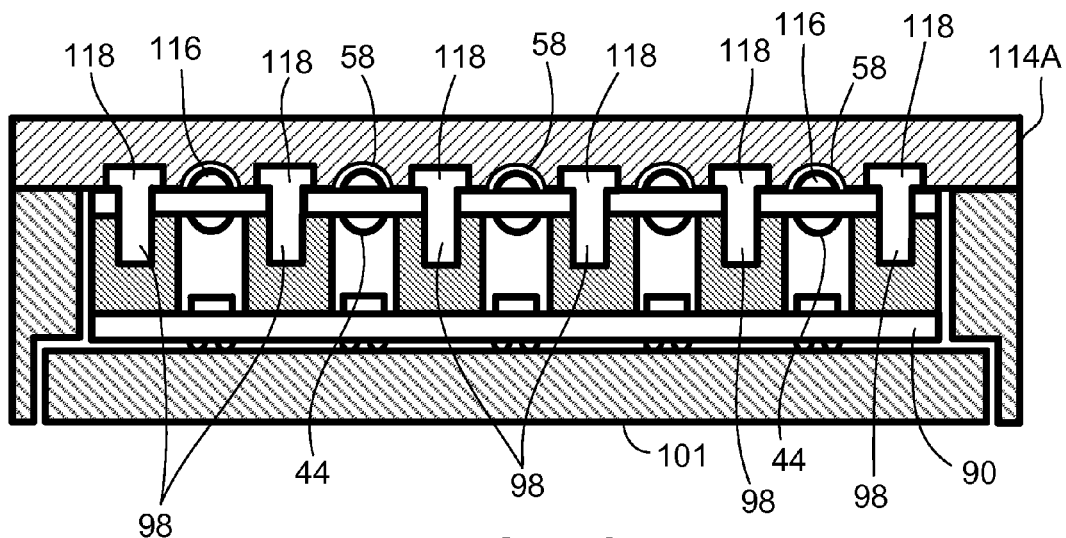

Next, as shown in FIG. 7C, a combined vacuum injection and replication tool 114A is placed over the transparent wafer 72 on the side opposite the spacers 46, and a vacuum chuck 101 is provided below and around the spacer/optics structure 84 so as to apply a vacuum between the vacuum injection tool 114A and the PCB substrate 90. In particular, vacuum injection and replication tool 114A is placed over transparent wafer 72 to facilitate the formation of optical elements (e.g., lenses) as well as the filling of trenches 98 with a non-transparent material (e.g., epoxy with carbon black). In addition to optical element replication sections 58, vacuum injection and replication tool 114A has openings 118 that are positioned above trenches 98 (see FIG. 7C). Optical elements 116 (e.g., lenses) can be replicated on the exterior surface of various portions of transparent wafer 72 in the same way as described above in connection with FIG. 6C.

Figure 7D:
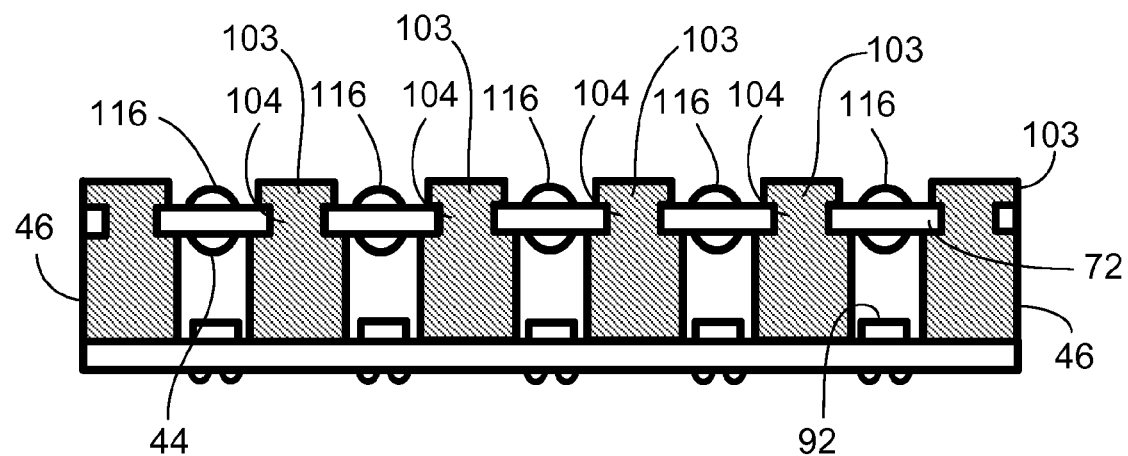

Next, non-transparent material (e.g., a black epoxy material) is injected through an inlet in the vacuum chuck 101 so that the epoxy (or other non-transparent material) fills the openings 118 and the trenches 98. As described above in connection with FIG. 4C, a vacuum pump near an outlet of the vacuum chuck 101 facilitates flow of the injected non-transparent material. The epoxy material subsequently is hardened (e.g., by UV or thermal curing), and the tool 114A is removed from the structure 84. The result, as shown in FIG. 7D, is that non-transparent regions 104 (e.g., epoxy with carbon black) are formed between adjacent portions of the transparent wafer 72. In addition, the non-transparent material (e.g., epoxy with carbon black) extends partially over the top surfaces of the various sections of the transparent wafer 72 to form projections 103 on either side of optical elements 116. Each non-transparent region 104 is in contact with, and bonds to, a non-transparent spacer 46. As in the previous example, non-transparent regions 103, 104 can be composed of the same non-transparent material or a different non-transparent material as spacers 46. This technique allows the projections 103 (which serve as baffles for the finished modules) to be formed in the same processing step in which the sidewalls of the various portions of transparent wafer 72 are covered by non-transparent material 104.

Figure 7E:
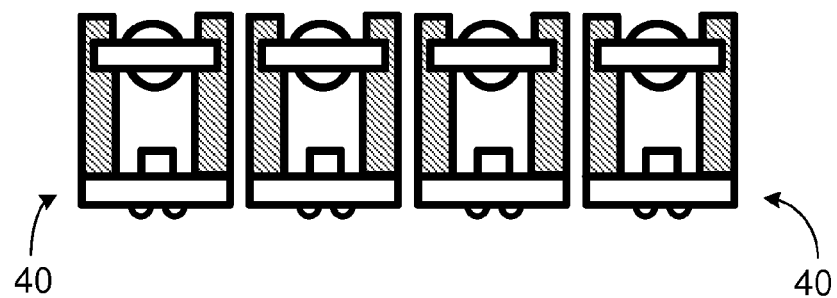

After forming the epoxy with carbon black regions 103, 104 and removing the vacuum injection and replication tool 114A, the wafer stack is separated along dicing lines to form individual modules 40 each of which includes an optoelectronic device 92 aligned with a vertical stack of optical elements 44, 116 attached to a transparent cover, whose exterior sidewalls are covered with, or embedded within, non-transparent material (see FIGS. 7E and 2B). Each module 40 also includes a non-transparent baffle (i.e., baffle 39 in FIG. 2B) that extends above the outer surface of the transparent cover. Thus, the foregoing technique can be used to fabricate multiple modules 40 on a wafer-level scale.

In the illustrated example of FIGS. 7A-7E, the PCB substrate 90 (with the optoelectronic devices mounted on its surface) is attached to the spacer/optics structure 84 before performance of the steps in FIGS. 7B-7E. In other implementations, the PCB substrate can be attached to the spacer/optics structure 84 later in the process (e.g., after performance of the steps in FIG. 7C). Furthermore, in some implementations, instead of attaching a PCB substrate (with the optoelectronic devices mounted on its surface) to the spacer/optics structure 84, individual singulated optoelectronic devices can be attached to the spacers.

Although the example of FIGS. 7A-7E results in modules that have optical elements (e.g., lenses) on both surfaces of the transparent cover, it is possible to omit the optical elements that are on the same surface of the transparent cover as the spacers such that each module includes only a lens or other optical element on the object side of the transparent cover, but not on its sensor side. To fabricate such modules, the replicated optical elements 44 could be omitted from the structure 84 of FIG. 3 before performing the subsequent steps described in connection with FIGS. 7A-7D.

In the foregoing examples of FIGS. 6A-6E and 7A-7E, the optical elements 116 on the side of the transparent wafer 72 opposite the spacers 46 are formed during a replication process (e.g., FIG. 6C or FIG. 7C) after forming the trenches 98 that extend through the transparent wafer 72 (e.g., FIG. 6B or FIG. 7B). However, in some implementations, the optical elements 116 can be formed during a replication process that is performed prior to forming the trenches 98. FIGS. 8A-8E illustrate an example of such a fabrication process.

Figure 8A:
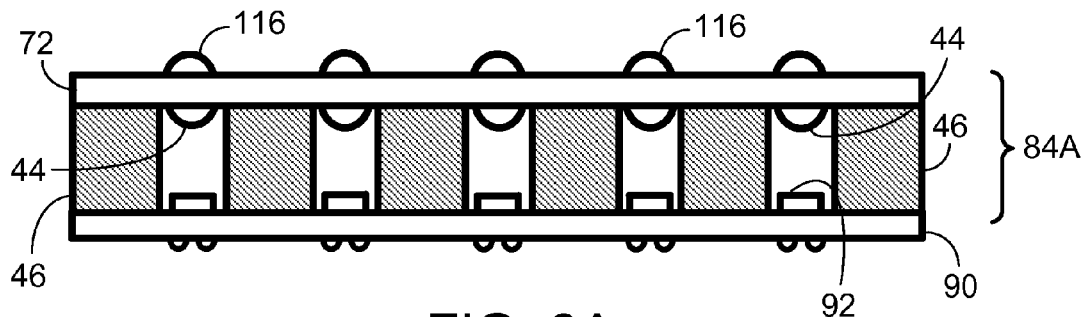
FIGS. 8A-8E illustrate steps in a further wafer-level fabrication process for making optoelectronic modules.
Figure 8B:
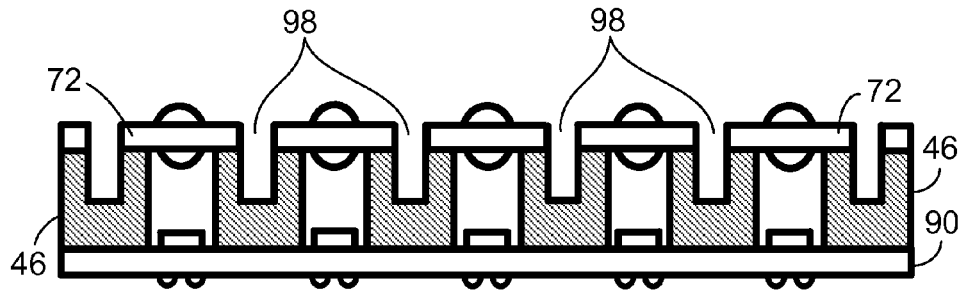

As shown in FIG. 8A, a wafer-scale spacer/optics structure 84A is provided and includes a first array of replicated optical elements 44 (e.g., lenses) and vacuum injected spacers 46 on one side of a transparent wafer 72. On the opposite side of the transparent wafer 72 is a second array of replicated optical elements 116 (e.g., lenses) substantially aligned with the first array. In some implementations, the first array of optical elements 44 can be omitted. In such cases, each of the resulting optoelectronic modules will have an optical element on the object side of the transparent cover, but not on its sensor side. The spacer/optics structure 84A is attached to a printed circuit board (PCB) or other substrate 90 on which are mounted multiple optoelectronic devices 92. Further details of the PCB substrate 90 and its attachment to the spacer/optics structure 84A can be similar to FIG. 4A. Also, as shown in FIG. 8B, openings such as trenches 98 are formed in the transparent wafer 72. Further details regarding formation of the trenches 98 can be similar to FIG. 4B.

Figure 8C:
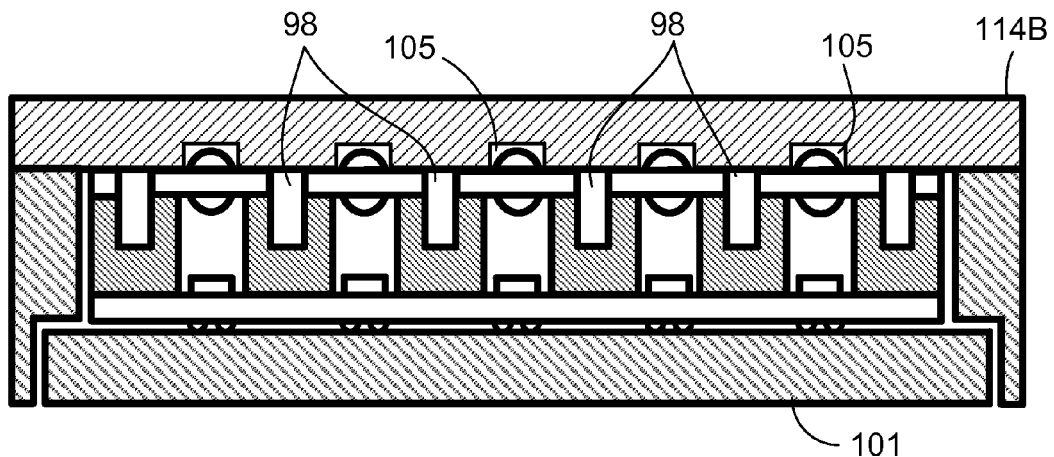
Figure 8D:
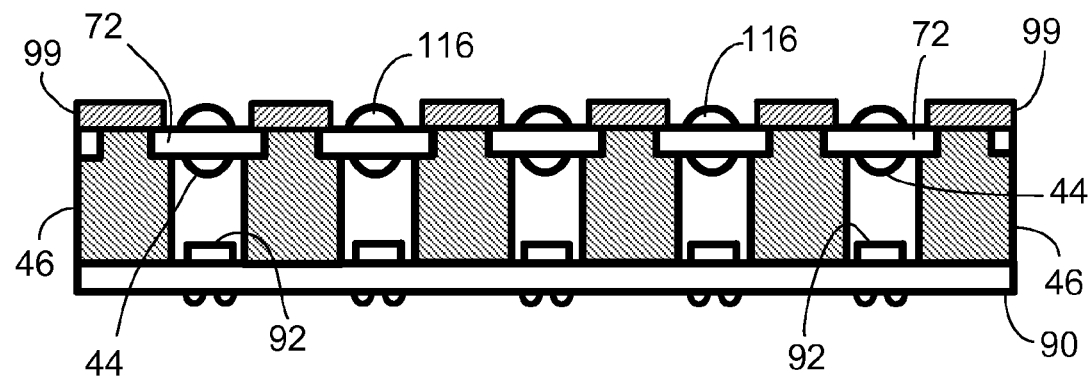

Next, as shown in FIG. 8C, a vacuum injection PDMS tool 114B is placed over transparent wafer 72 to facilitate filling trenches 98 with a non-transparent material (e.g., epoxy with carbon black). In particular, the tool 114B, which has spaces 105 to accommodate the previously-formed optical elements 116 on the spacer/optics structure 84A, is placed over the side of transparent wafer 72 on which the optical elements 116 are formed. A vacuum chuck 101 is provided below and around the spacer/optics structure 84A so as to apply a vacuum between the vacuum injection tool 114B and the PCB substrate 90. The non-transparent material can be injected into an inlet in the vacuum chuck 101. As described above in connection with FIG. 4C, a vacuum pump near an outlet of the vacuum chuck 101 facilitates flow of the injected non-transparent material. After filling trenches 98 with the non-transparent material (e.g., epoxy with carbon black) under vacuum, the epoxy material is hardened (e.g., by UV or thermal curing), and the tool 114B is removed from the spacer/optics structure 84A. The result, as shown in FIG. 8D, is that non-transparent regions 104 of epoxy with carbon black are formed between adjacent portions of the transparent wafer 72. Each non-transparent region 104 is in contact with, and bonds to, a non-transparent spacer 46. Non-transparent regions 104 are flush with the exterior surface of the various portions of the transparent wafer 72 and can be composed of the same non-transparent material or a different non-transparent material as spacers 46. If desired, a baffle wafer 99 can be attached over the structure 84A of FIG. 8C to provide baffles for the modules. If provided, the baffle wafer can be attached to the structure 84A on the side opposite the spacers 46. In other implementations, the baffle wafer 99 can be omitted.

Figure 8E:
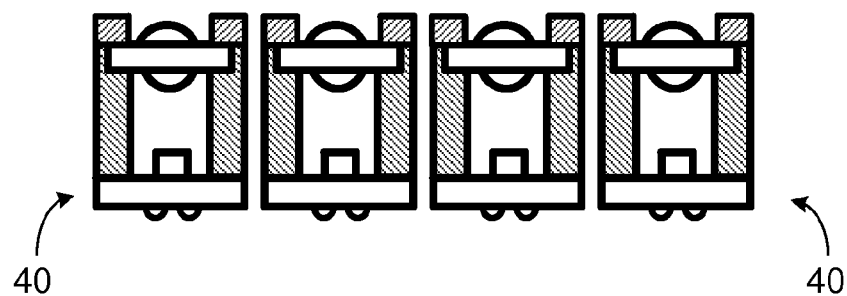

After forming the epoxy with carbon black regions 104 and removing the vacuum injection tool 114B, the wafer stack is separated along dicing lines to form individual optoelectronic modules 40 each of which includes an optoelectronic device aligned with a lens element attached to a transparent cover, whose exterior sidewalls are covered with, or embedded within, non-transparent material (see FIGS. 8E and 2B). Thus, the foregoing technique can be used to fabricate multiple modules 40 on a wafer-level scale.

In the illustrated example of FIGS. 8A-8E, the PCB substrate 90 (with the optoelectronic devices mounted on its surface) is attached to the spacer/optics structure 84A prior to performance of the steps in FIGS. 8B-8D. In other implementations, the PCB substrate can be attached to the spacer/optics structure 84A later in the process (e.g., after performance of the steps in FIG. 8C). Furthermore, in some implementations, instead of attaching a PCB substrate (with the optoelectronic devices mounted on its surface) to the spacer/optics structure 84A, individual singulated optoelectronic devices can be attached to the spacers.

Figure 9A:
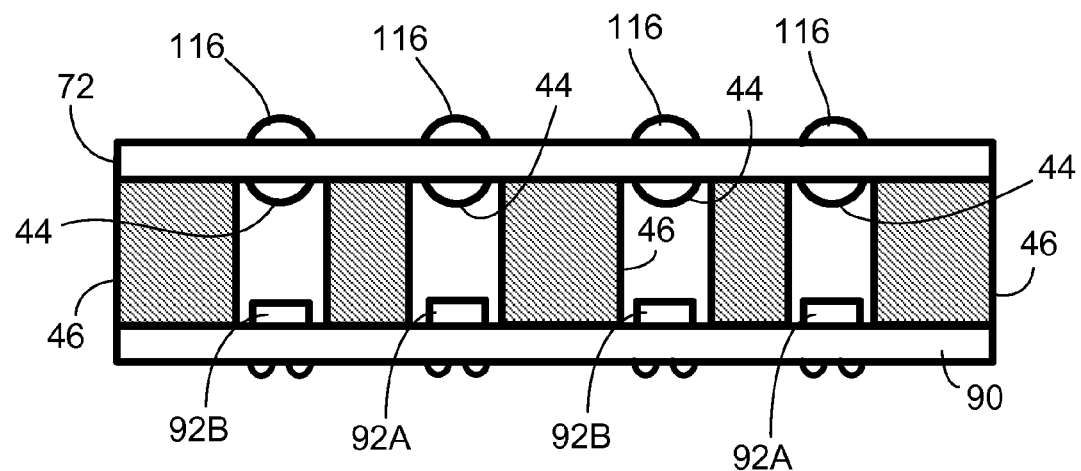
FIGS. 9A and 9B illustrate steps for fabrication of proximity sensor modules that include both a light emitting element and a light detecting element in adjacent channels.
Figure 9B:
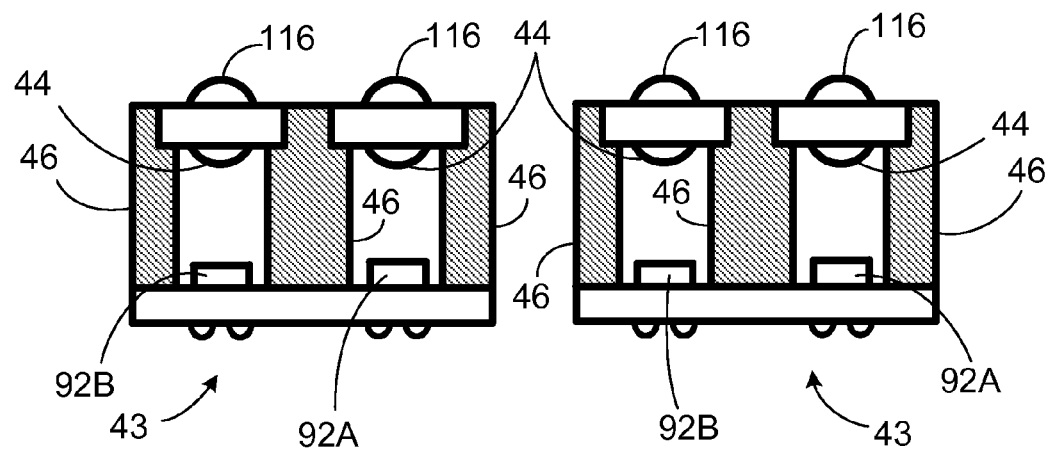

A wafer-level process substantially similar to the process of FIGS. 8A-8E also can be used to fabricate modules that include both a light emitting element and a light detecting element. For example, as shown in FIG. 9A, a spacer/optics structure 84A is attached to a printed circuit board or other substrate 90 on which are mounted multiple optoelectronic devices 92 (e.g., light emitting elements 92A and light detecting elements 92B). As discussed in previous examples, the spacers 46 can be provided, for example, by a replication or vacuum injection technique, or by attaching a spacer wafer to the transparent wafer 72 on which the lenses 116, 44 are formed. The light emitting and detecting elements 92A, 92B alternate such that each light emitting element 92A is adjacent to a light detecting element 92B. Trenches then can be formed and filled with a non-transparent material described in connection with FIGS. 8B and 8C. After removal of the vacuum injection tool, the resulting structure can be separated (e.g., by dicing) into multiple modules 43 each of which includes adjacent optical channels, one of which includes a light emitting element 92A (e.g., a LED) and one of which includes a light detecting element 92B (e.g., a photodiode). The adjacent optical channels are separated from one another by a non-transparent spacer 46. Such modules can be used, for example, as proximity sensors. Furthermore, proximity sensor modules (and other modules that include both a light emitting element and a light detecting element) can be fabricated using processes similar to those of FIG. 6A-6E or 7A-7E (i.e., processes that employ a combined replication and vacuum injection tool to form the optical elements by replication and the spacer elements by vacuum injection). The foregoing modules also can be formed with a baffle structure, if desired. Such a baffle structure can be provided, for example, by including baffle features in the combined replication and vacuum injection tool (see, e.g., FIG. 7C) or by attaching a baffle wafer.

Some modules (e.g., camera modules) can include a vertical stack of two or more transparent substrates, each of which includes optical elements (e.g., lenses) on one or both sides. Steps in a wafer-level process for fabricating such modules are illustrated in FIGS. 10A-10C and include forming openings (e.g., trenches) through a stack of two or more transparent wafers.

Figure 10A:
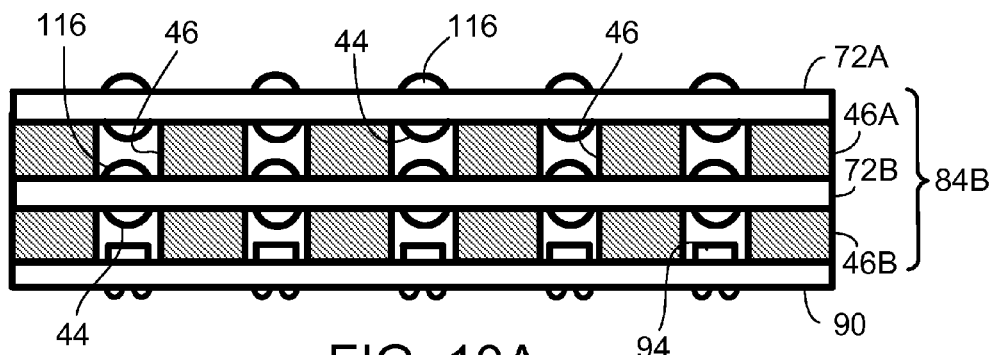
FIGS. 10A-10C illustrate steps in a wafer-level process for making modules that include a vertical stack of optical elements.

As shown, for example, in FIG. 10A, a spacer/optics structure 84B is provided. The structure 84B includes a wafer stack formed of a first transparent wafer 72A, a first spacer structure 46A, a second transparent wafer 72B and a second spacer wafer 46B. The first spacer structure 46A can be provided, for example, as a separate spacer wafer or by vacuum injection. Each of the transparent wafers 72A, 72B has replicated optical elements 44, 116 formed on one or both of its respective surfaces. The wafers are attached to one another, for example, by an adhesive. In some implementations, instead of attaching spacer wafers 46A, 46B to the transparent wafers 72A, 72B, spacer elements 46 can be formed on the respective surfaces of the transparent wafers 72A, 72B by vacuum injection, as described above in connection with FIG. 3. Spacer/optics structure 84B is attached to a printed circuit board (PCB) or other substrate 90 on which are mounted image sensors 94. Further details of the PCB substrate 90 and its attachment to the spacer/optics structure 84B can be similar to FIG. 4A. In some implementations, focal length correction (e.g., flange focal length (FFL) correction) can be provided by micromachining the thickness of the spacer wafer 46B or by attaching another transparent FFL substrate to adjust the FFL of the optical channel(s).

Figure 10B:
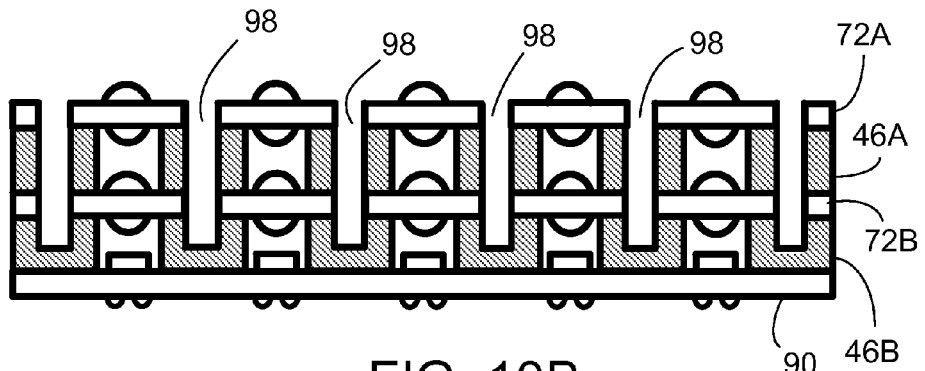
Figure 10C:
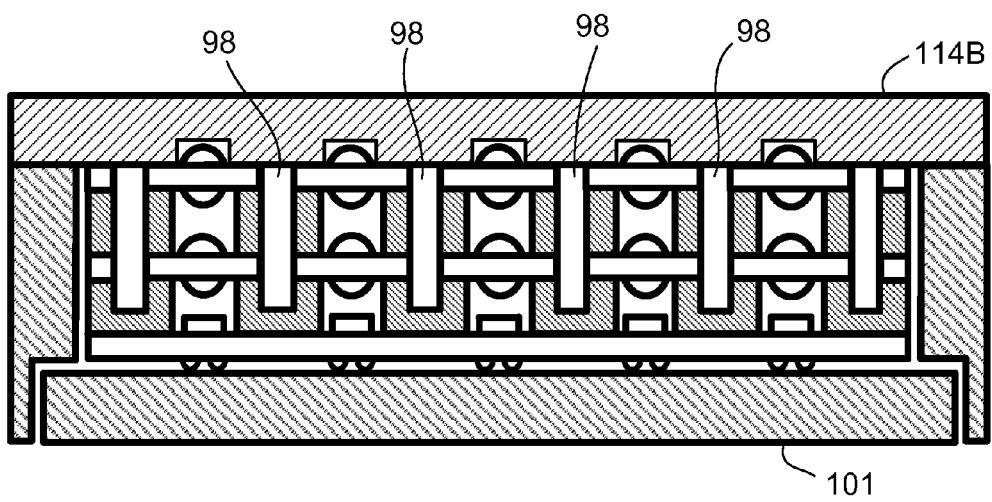

Next, as shown in FIG. 10B, openings (e.g., trenches) 98 are formed through the transparent wafers 72A,72B. Trenches 98 should extend entirely through the thickness of both transparent wafers 72A, 72B (and through the thickness of the first spacer structure 46A) and, preferably, should extend partially into the second spacer structure 46B. If a transparent FFL substrate is provided for FFL correction of the optical channel(s), the trenches can extend into the FFL substrate as well. Trenches 98 can be formed, for example, by dicing, micromachining or laser cutting techniques. The result is a non-planar surface that includes trenches 98 formed between adjacent portions of the transparent wafers. As shown in FIG. 10C, a vacuum injection PDMS tool 114B is placed over the first transparent wafer 72A to facilitate filling trenches 98 with a non-transparent material (e.g., epoxy with carbon black), and a vacuum chuck 101 is provided below and around the spacer/optics structure 84B so as to apply a vacuum between the vacuum injection tool 114B and the PCB substrate 90. The non-transparent material can be injected into an inlet in the vacuum chuck 101. As described above in connection with FIG. 4C, a vacuum pump near an outlet of the vacuum chuck 101 facilitates flow of the injected non-transparent material. After filling trenches 98 with the non-transparent material (e.g., epoxy with carbon black) under vacuum, the epoxy material is hardened (e.g., by UV or thermal curing), and the tool 114B is removed from the spacer/optics structure 84B. The material with which the trenches 98 are filled can be the same as or different from the material of the spacers 46. In some implementations, a baffle wafer composed of a non-transparent material can be attached over the spacer/optics structure. Alternatively, in some implementations, baffle features are provided in the vacuum injection tool 114B, and the baffle structure is formed by vacuum injection as described above.

Figure 10D:
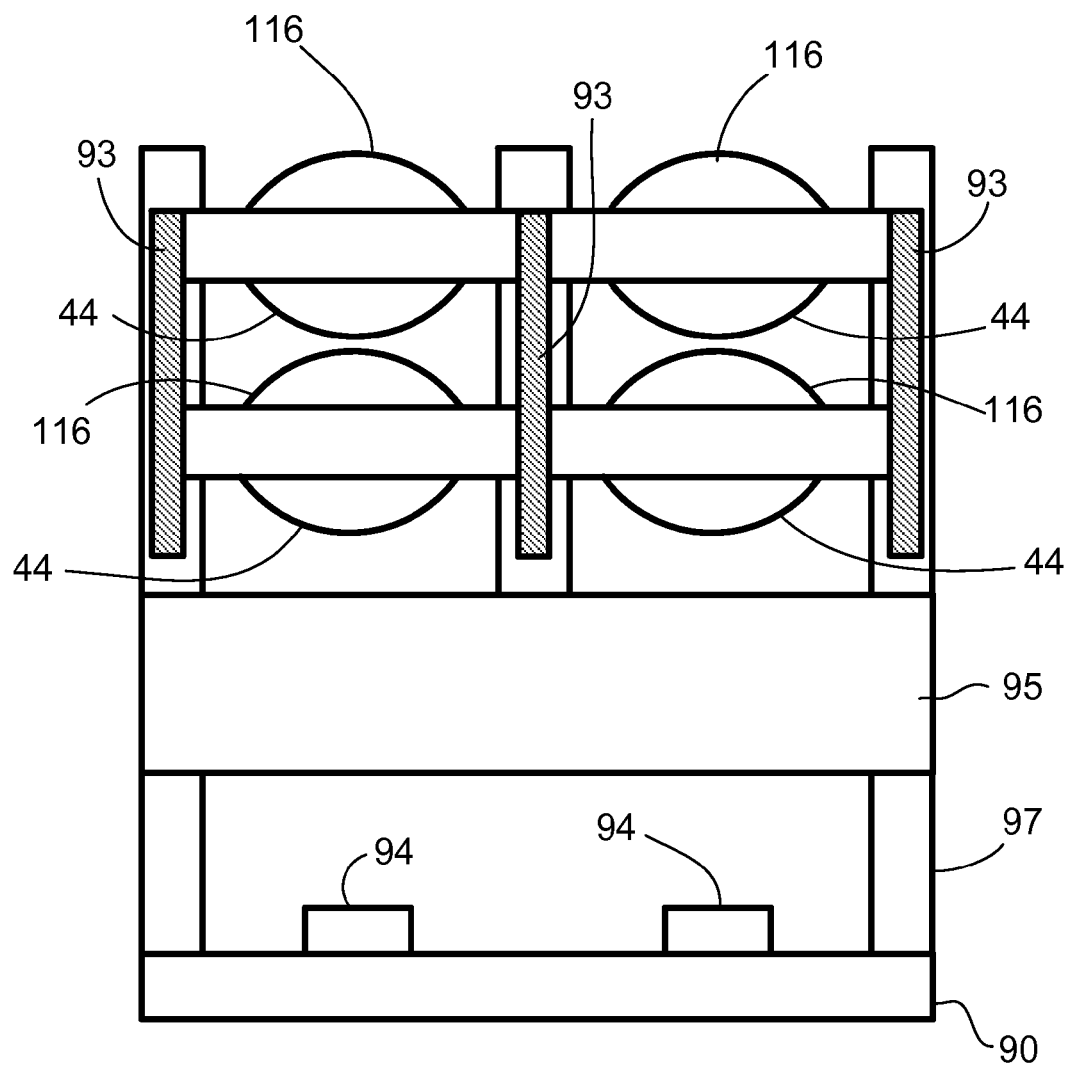
FIG. 10D illustrates an example of an image sensor module that includes a vertical stack of optical elements.

The wafer stack then can be separated, for example, along dicing lines to form individual optoelectronic modules each of which includes an image sensor aligned with vertical stacks of optical elements attached to transparent substrates, whose exterior sidewalls are covered with, or embedded within, non-transparent material 93 (see, e.g., FIG. 10D). The illustrated example module of FIG. 10D shows an array of camera (e.g., a 2×2 or any other M×N array) including a transparent substrate 95 for FFL channel correction, and an additional spacer 97 that separates the FFL correction substrate 95 from the substrate 90 on which the image sensor 94 is mounted. The additional spacer 97 can provide additional FFL correction for the module.

In the foregoing examples, after forming the trenches 98 in the transparent wafer 72, which results in a non-planar structure, sidewalls of the various sections of the transparent wafer 72 (or 72A, 72B) are covered with a non-transparent material by a vacuum injection technique. In some implementations, a different technique can be used to cover the sidewalls of the various sections of the transparent wafer 72 with a non-transparent material. For example, after forming trenches 98, the sidewalls of the various sections of the transparent wafer 72 can be coated with one or more layers 108 of non-transparent material(s) (see FIG. 11). In a particular implementation, one or more coatings are applied to the side and top surfaces of the various sections of the transparent wafer 72. The layers 108 can be composed, for example, of a polymer resist-type material, a metallic material (e.g., aluminum) or a black chromium material. The layers can be applied, for example, using PVD, CVD, dip coating, spray coating, sputtering or evaporation techniques. The thickness of the layers 108 depends on the implementation, but preferably each coating layer has a thickness in the range of about 5-40 microns (μm) and, in some implementations, each coating layer has a thickness in the range of about 10-20 μm. After depositing the layers 108, baking (i.e., heating at an elevated temperature) may be performed.

Figure 11:
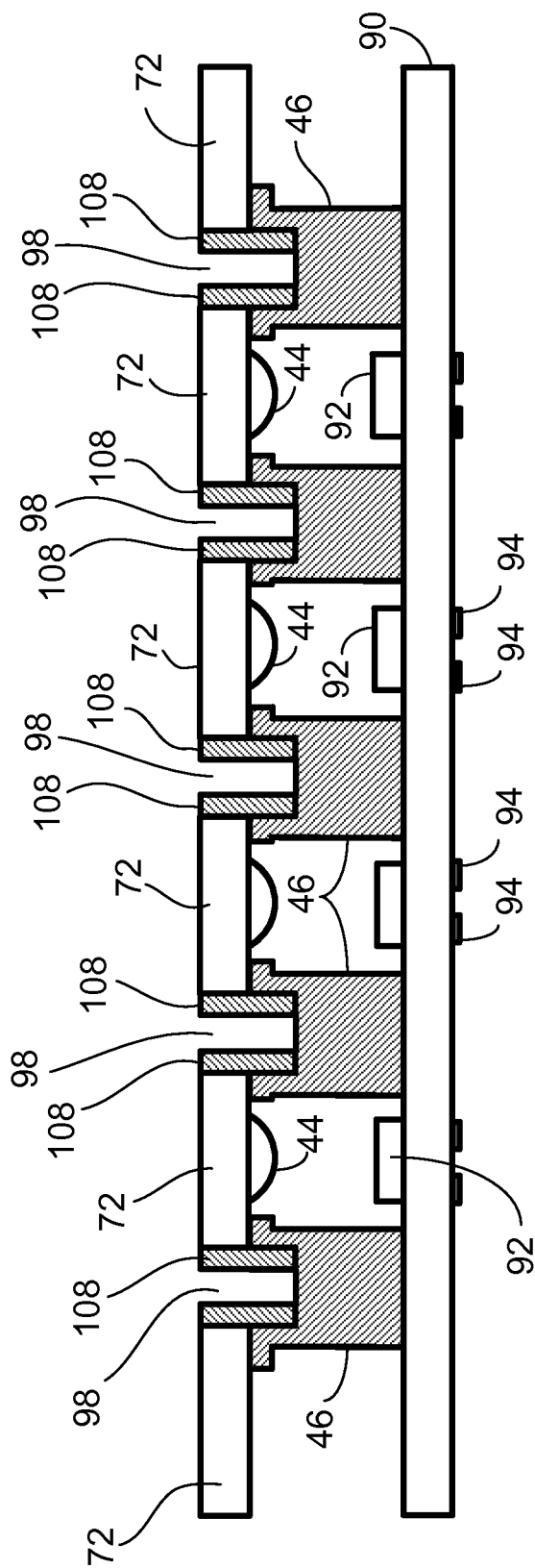
FIG. 11 illustrates yet another example of a wafer-level process for making optoelectronic modules.

After depositing and baking the layers 108, the layers over the top surfaces of the various portions of the non-transparent wafer 72 are removed using, for example, photolithographic, chemical or mechanical techniques. If a photolithographic technique is used, a photolithographically structurable coating (e.g., a photoresist coating) can be used. If a chemical technique is used, an appropriate solvent can be provided to etch away the coating layers from the top surface of the various portions of the non-transparent wafer 72. In some implementations, the layers are removed from the top surfaces of the various portions of the non-transparent wafer 72 mechanically by applying a tape having an adhesive surface. After removal of the coating layers from the top surfaces of the various portions of the non-transparent wafer 72, the sidewalls of the various portions of the non-transparent wafer 72 remain covered with coating layers 108, as shown in FIG. 11. The wafer stack then can be separated (e.g., by dicing) to form individual modules each of which includes a light emitting element 92 aligned with an optical element (e.g., lens 44). As in the previous examples, the sidewalls of the module's transparent cover are covered with non-transparent material so as to reduce light leakage.

Furthermore, although the foregoing examples include a single optoelectronic device (e.g., light emitting or light detecting element) in each module, techniques similar to the foregoing techniques can be used to fabricate modules that include two or more light emitting elements, each of which is aligned with one or more respective optical elements. Such modules, which can include non-transparent sidewalls surrounding two or more light emitting elements without a spacer separating the light emitting elements from one another, can serve, for example, as dual LED flash modules. In some implementations, the modules also may include other optoelectronic or optical components.

The modules described above include a replicated lens one or both sides of the transparent cover 26. In some cases, however, an optical filter layer may be provided on the transparent cover. Likewise, in some implementations, a focal flange length (FFL), correction layer may be applied on the transparent cover. The FFL sometimes is referred to as a flange focal distance. Including a FFL correction layer can be particularly advantageous, for example, for image sensor applications. Thus, in some instances, the transparent cover 26 may include a replicated lens on one side only or, in some cases, may not include a replicated lens on either side. An example is illustrated in FIGS. 12A and 12B, which show multi-channel modules 200A and 200B, respectively.

Figure 12A:
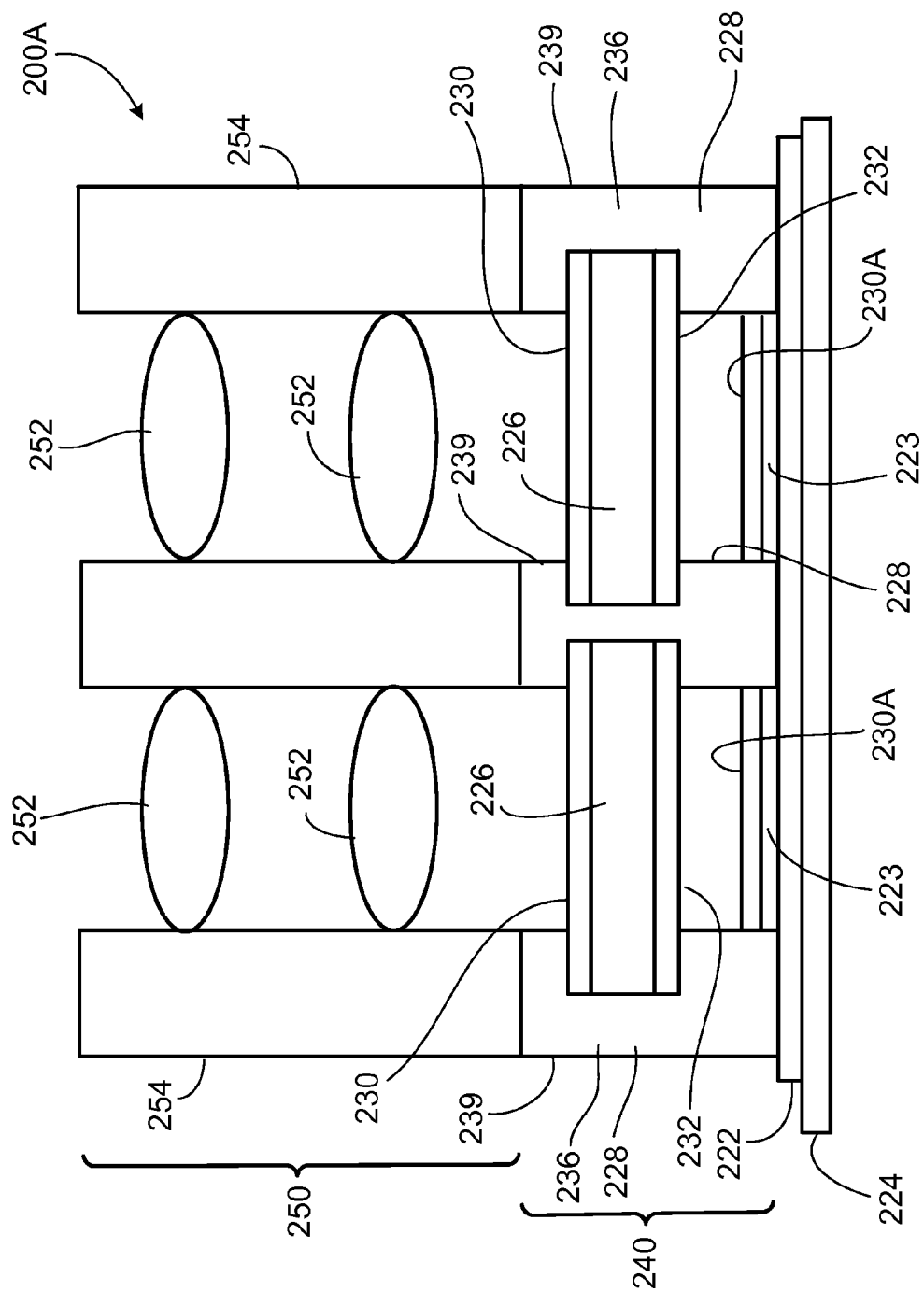
FIGS. 12A-12D illustrate examples of image sensor modules.
Figure 12B:
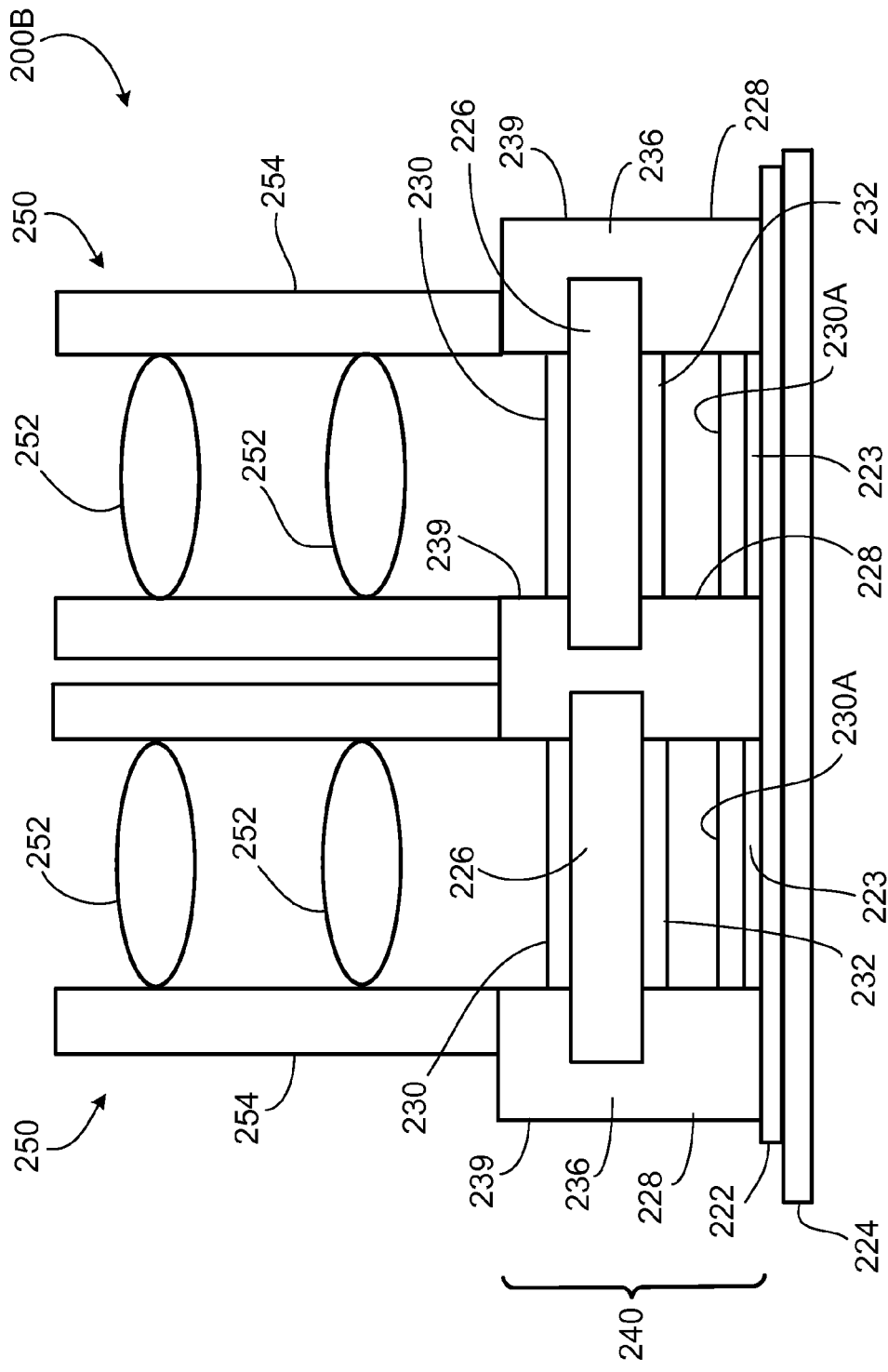

Modules 200A and 200B of FIGS. 12A and 12B include an image sensor 222 supported on a PCB or other substrate 224. Image sensor 222 has optically sensitive regions 223 that are surrounded laterally by a spacer 228, which also serves as sidewalls for the sensor-side of the module. Side edges of the transparent covers 226 are embedded within the spacers, which can be composed, for example, of a non-transparent material (e.g., epoxy with carbon black). Transparent covers 226 can be composed, for example, of glass, sapphire or a polymer material, and are separated from image sensor 222 by spacer 228. In the illustrated examples of FIGS. 12A and 12B, the object-side of each transparent cover 226 includes an optical filter 230, which can be implemented, for example, as a thin coating. Likewise, the sensor-side of each transparent cover may include a FFL correction layer 232 to correct for the channel focal length. The thickness of the FFL correction layer 232 in each channel may vary from the thickness of the FFL layer 232 in another channel. In some cases, only some of the channels have a FFL correction layer.

Non-transparent material 239 may extend beyond the top of transparent covers 226 near their edges. Depending on the implementation, non-transparent material 236 that covers the sidewalls of the transparent covers 226 can be the same as, or different from, the material of the spacer 228 and/or the non-transparent material 239 that extends beyond the top of the transparent covers 226. The exterior side of PCB substrate 224 can includes conductive contacts, which can be coupled electrically to image sensor 222 by way of conductive vias extending through substrate 224.

The modules 200A, 200B can include one or more optics assemblies 250. The optics assemblies can be attached to an assembly 240 that is composed of the transparent covers 226 (including the FFL correction layer 232 and the filter layer 230, if present) and non-transparent walls/spacers 228, 236, 239. Each optics assembly 250 can include, for example, a stack of one or more injection molded optical elements (e.g., lenses) 252 placed in a lens barrel 254. In some cases, an array of injection molded lens stacks can be provided collectively for all the optical channels (see FIG. 12A), whereas in other implementations, a separate lens stack is provided for each respective channel (see FIG. 12B).

Multiple assemblies 240 including transparent covers 226 (together with the FFL correction layer 232 and/or the filter layer 230) and non-transparent walls/spacers 228, 236, 239 can be fabricated as part of a waver-level process. For example, to fabricate assemblies 240, a process similar to the one described in connection with FIGS. 5A-5E can be used, except that instead of lenses being formed on the transparent wafer, a FFL correction layer is provided on the transparent wafer. The FFL correction layer may be composed, for example, of a glass or polymer material, and can be applied, for example, by spin coating, spraying or sputtering. An optical filter layer may be applied to the other side of the transparent wafer. The spacers and walls for the modules can be formed using the techniques described in detail above (e.g., replication or vacuum injection, trench formation and filling of the trenches with non-transparent material). Transient substrates (e.g., UV dicing tape, a PDMS substrate, a glass substrate, a polymer wafer) can be used to support the structure during the foregoing steps. In some cases, a lens may be replicated on the surface of the optical filter layer. Further, if an optical filter layer is not provided on the transparent wafer, then in some cases, a lens may be replicated directly on the surface of the transparent wafer.

Next, optics assemblies (i.e., lens stacks) can be attached to the object-side of the spacer/optics/embedded transparent cover assemblies. This can be accomplished either on a wafer-level scale or by attaching individual lens stacks to the spacer/optics/embedded transparent cover assemblies. Next, the focal length (e.g., FFL) of each optical channel can be measured and compared to a specified value. If the measured FFL for particular channel deviates from a desired value, the FFL correction layer can be removed selectively in that channel to correct for the FFL value. Photolithographic techniques can be used, for example, to partially or entirely remove the FFL correction layer, as needed. Since the channels may have different FFL values, different amounts of the channel FFL correction layer may be needed to achieve corrected FFL values for the various channels. For some channels, no FFL correction may be needed. In other cases, a portion of the channel FFL correction layer may be removed. In yet other cases, no portion of the channel FFL correction layer may be removed. Thus, depending on the implementation, the channel FFL correction layer may be present for all of the channels or for only some of the channels. Furthermore, the thickness of the final channel FFL correction layer may vary from one channel to the next, depending on the amount of FFL correction needed in each channel.

The wafer-level structure (including the spacers, embedded transparent covers, and optics assemblies) then can be separated into individual assemblies, each of which includes, for example, an array of optical channels. Each of the separated assemblies then can be attached to an individual image sensor assembly (i.e., a PCB substrate on which is mounted an imager sensor).

In some implementations, it may be desirable to provide an optical filter 230A directly on the active photosensitive regions 223 of the image sensor 222. Such filters can be provided, for example, instead of the filters 230 on the transparent cover 226. This arrangement may be useful, for example, where a lens is replicated on the surface of each transparent cover 226.

Figure 12C:
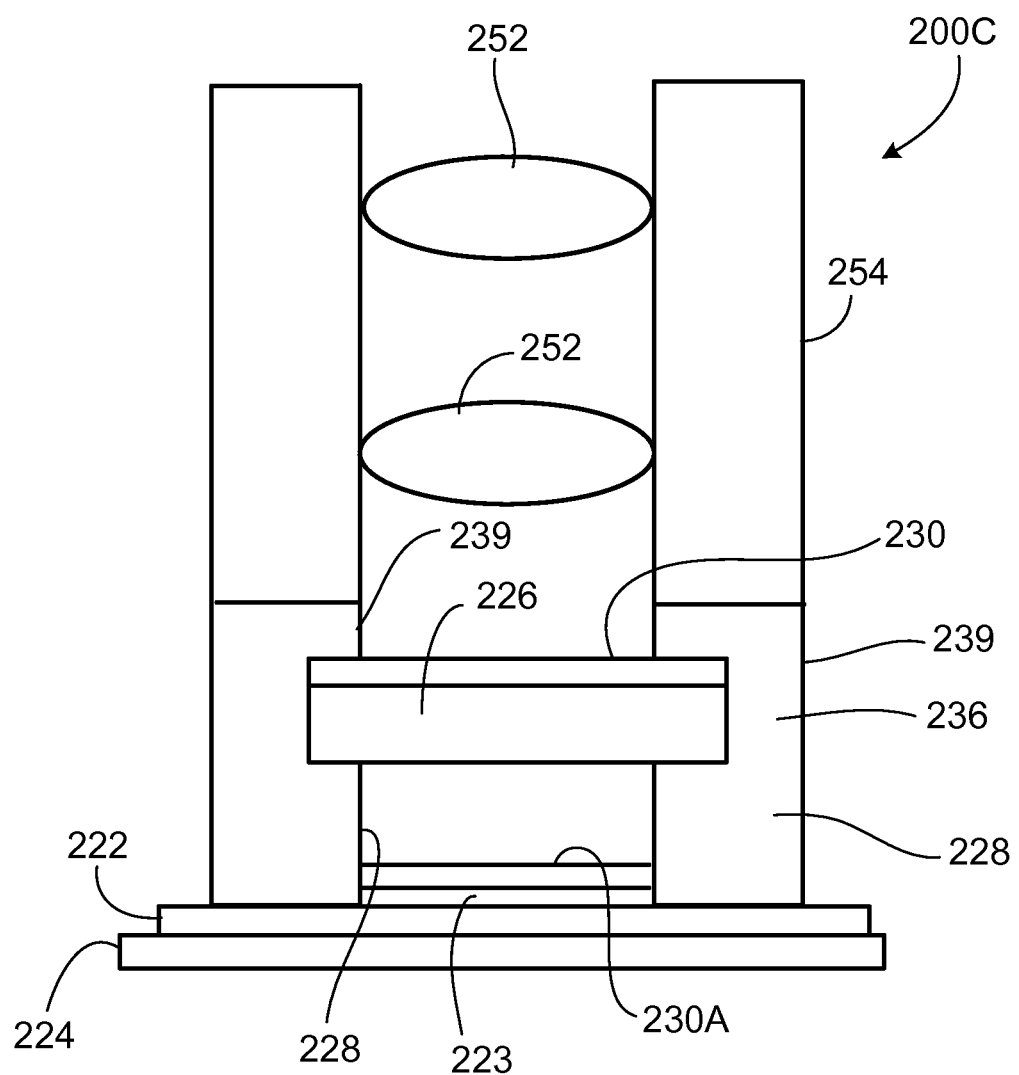

Each of the modules of FIGS. 12A and 12B includes multiple optical channels. Single modules that include similar features can be provided as well. An example of such a module 200C is illustrated in FIG. 12C. The sidewalls of the transparent cover 226 as well as the sidewalls of the optical filter 230 are encapsulated by the non-transparent material of the spacer 228. The module 200C also includes an optics assembly implemented as a stack of one or more injection molded optical elements (e.g., lenses) 252 placed in a lens barrel 254. In the illustrated example, the module 200C does not include an FFL correction layer 232.

Figure 12D:
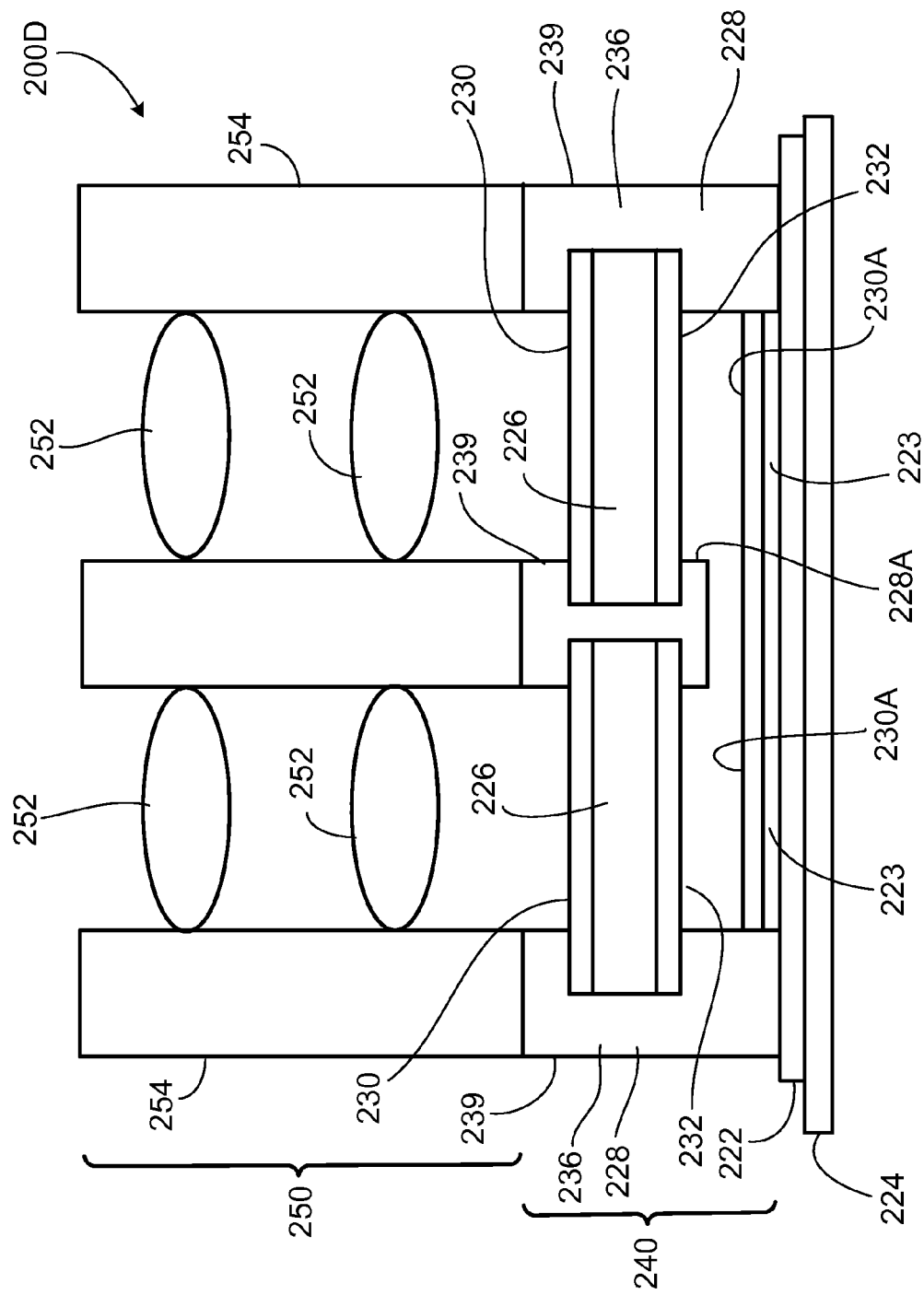

As illustrated in the examples of FIGS. 12A and 12B, the bottom of the spacer 228 extends to, and is in contact with, the upper surface of the image sensor 222. In some instances, however, as shown in the module 200D of FIG. 12D, the bottom of the interior part 228A of the spacer 228 between the two adjacent optical channels does not extend to the upper surface of the image sensor 222 (or to the upper surface of the optical filter 230A, if present). The bottom of the interior part 228A of the spacer 228 between the two channels may, thus, not be in contact with any surface. Further, in some implementations, the optical filter 230A, if present, can be formed as a contiguous coating that spans both channels. In other cases, each channel may have an optical filter 230A that has different optical properties from the filter in the other channel.

The optical filters discussed above can be implemented in various ways. For example, in some implementations, a dielectric band-pass filter can be applied to the photo sensitive surface of the light sensing element (e.g., an image sensor) or to a surface of the transparent cover that is disposed over the light sensing element. In some cases, such a band-pass filter is deposited onto the transparent cover (or onto a transparent wafer in the case of a wafer-level process) by vapor deposition or sputtering. Preferably the dielectric filter is deposited onto a transparent cover composed, for example, of glass, sapphire or another transparent material that has mechanical/thermal-expansion properties similar those of glass or sapphire. The band-pass filter can be advantageous because it permits a very narrow range of wavelengths to impinge on the light sensing element (e.g., a photodiode or image sensor). An example of a module 300 that incorporates a dielectric band-pass filter 230B on the surface of the transparent cover 226A in the optical detection channel is illustrated in FIG. 13.

Figure 13:
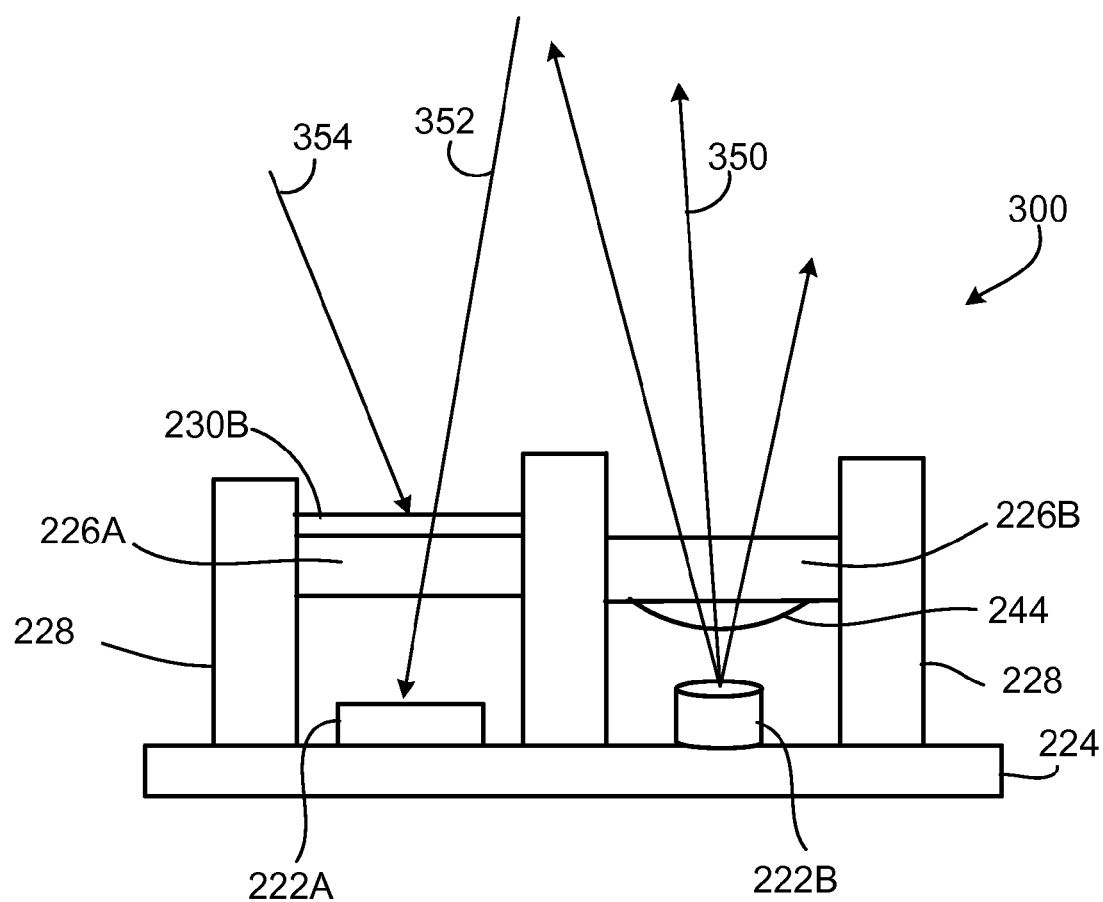
FIG. 13 illustrates an example of a module that includes a dielectric band-pass filter.

The module 300 of FIG. 13 includes two optical channels: an optical emission channel and an optical detection channel. The emission channel includes a light emitting device (e.g., a LED or laser diode) 222B, and the detection channel includes a light sensing device (e.g., a photodiode or image sensor) 222A. The devices 222A, 222B are mounted on a common PCB or other substrate 224. Each channel includes a respective transparent cover 226A, 226B that intersects the optical axis of the channel. The side edges of the transparent covers 226A, 226B can be covered by or embedded within non-transparent material, in accordance with the techniques described above. The transparent cover 226B in the emission channel may include one or more optical elements (e.g., a lens) 244 on its surface. Likewise, the transparent cover 226A in the detection channel includes a dielectric band-pass filter 230B on its surface. The range of transmission of the band-pass filter 230B may be selected to match substantially the range of emission from the light emitting device 222B. For example, in some instances, the light emitting device 222B is operable to emit infra-red light (e.g., about 937 nm+10 nm), and the band-pass filter is operable to allow only light in the same range to pass to the light sensing device 222A. Such an arrangement allows light 350 from the light emitting device 222B to be reflected by an object or scene. Some of the reflected light 352 can be sensed by the light sensing device 222A, whereas light 354 (e.g., ambient light) at wavelengths outside the range of the filter 230B are blocked.

In the fabrication examples described above, a spacer/optics structure (e.g., 84 in FIG. 4A) is attached directly by adhesive to a PCB or other substrate wafer on which are mounted multiple optoelectronic devices (e.g., light emitting elements or light detecting elements). In particular, the free ends of the spacer elements of the spacer/optics structure is attached directly by adhesive to the PCB or other substrate wafer. In the resulting modules, the spacer 46 that separates the PCB or other substrate 90 from the transparent wafer 72 is composed of a non-transparent material, such as a vacuum injected polymer material (e.g., epoxy, acrylate, polyurethane, or silicone) containing a non-transparent filler (e.g., carbon black, pigment, or dye). In some implementations, however, instead of attaching the spacer/optics structure directly to the PCB or other substrate wafer 90, the spacer/optics structure 84 is attached to a structural element on the surface of the substrate wafer. An example is illustrated in FIG. 14, which is discussed below.

Figure 14A:
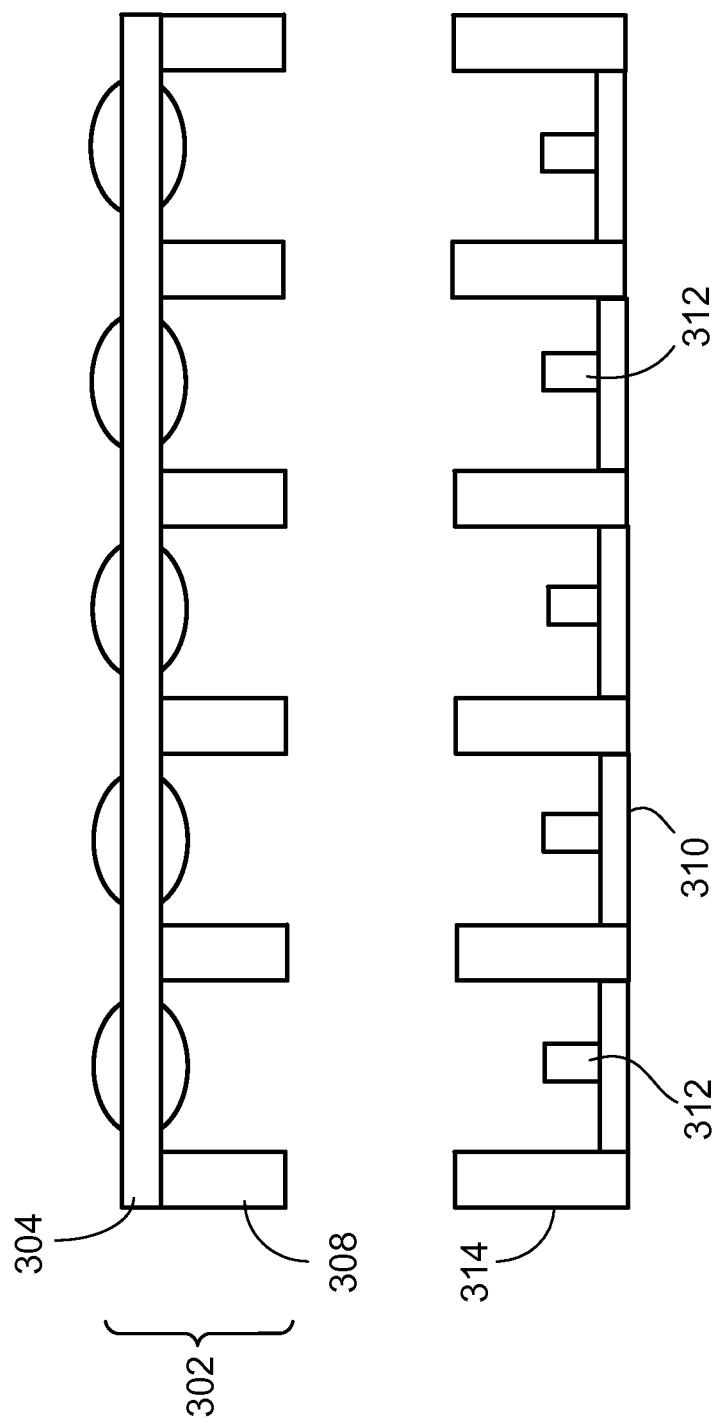
FIGS. 14A, 14B and 14C illustrate steps in a further example of a wafer-level fabrication process for making optoelectronic modules.
Figure 14B:
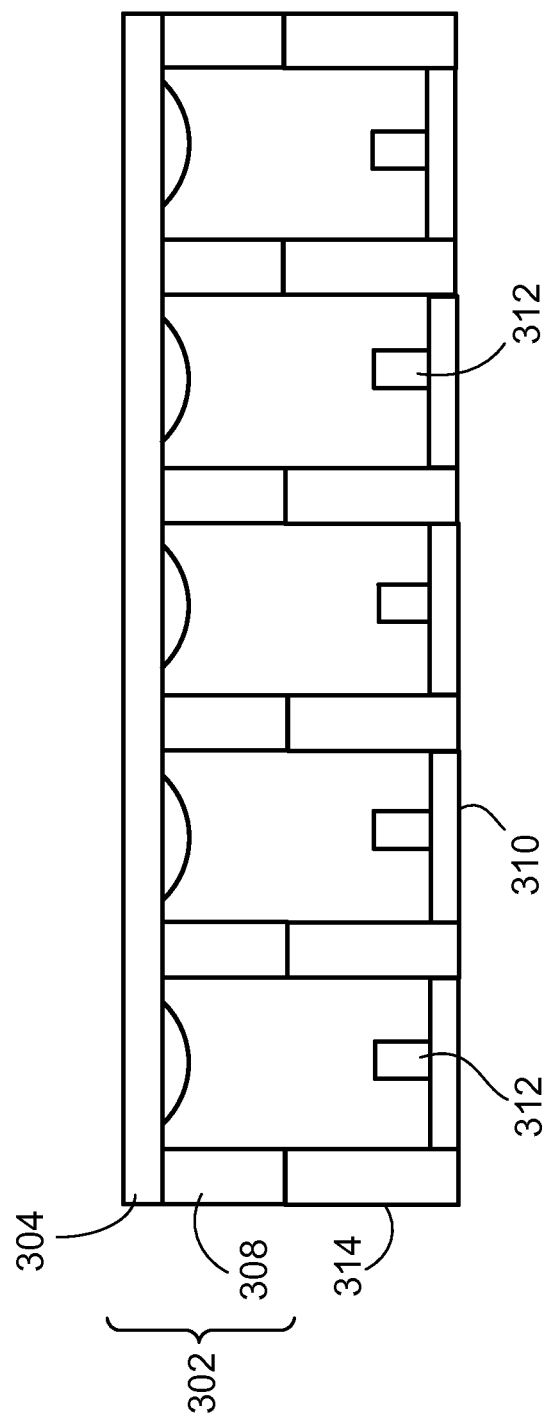

As shown in FIG. 14A, a spacer/optics structure 302 includes a transparent cover 304 and a spacer 308. A substrate wafer 310 comprises a metal frame 310 and molded cavity 314 (a lead frame). The metal frame, which may be composed for example of a metal such as copper, aluminum or nickel, has optoelectronic devices 312 mounted on its surface and spaced laterally form one another. Further, the molded cavity 314 should have dimensions that match those of the spacer 312 such that the free ends of the spacer 308 and molded cavity 314 can be attached directly to one another by adhesive, as shown in FIG. 14B. This can be particularly advantageous, for example, as the substrate wafer can be relatively inexpensive. The stack formed by the spacer/optics structure 302 and the substrate wafer 318 then can be processed in accordance with any of the various techniques described above to fabricate modules in which the non-transparent spacer material covers the sidewalls of the transparent cover (see, e.g., FIG. 14C). In some cases the transparent cover may include an optical element on one or both of its surfaces. The optical element can be, for example, a lens, an optical filter or a FFL correction layer. In some cases, an optics assembly 250 including a stack of lenses can be attached over the transparent cover.

Figure 14C:
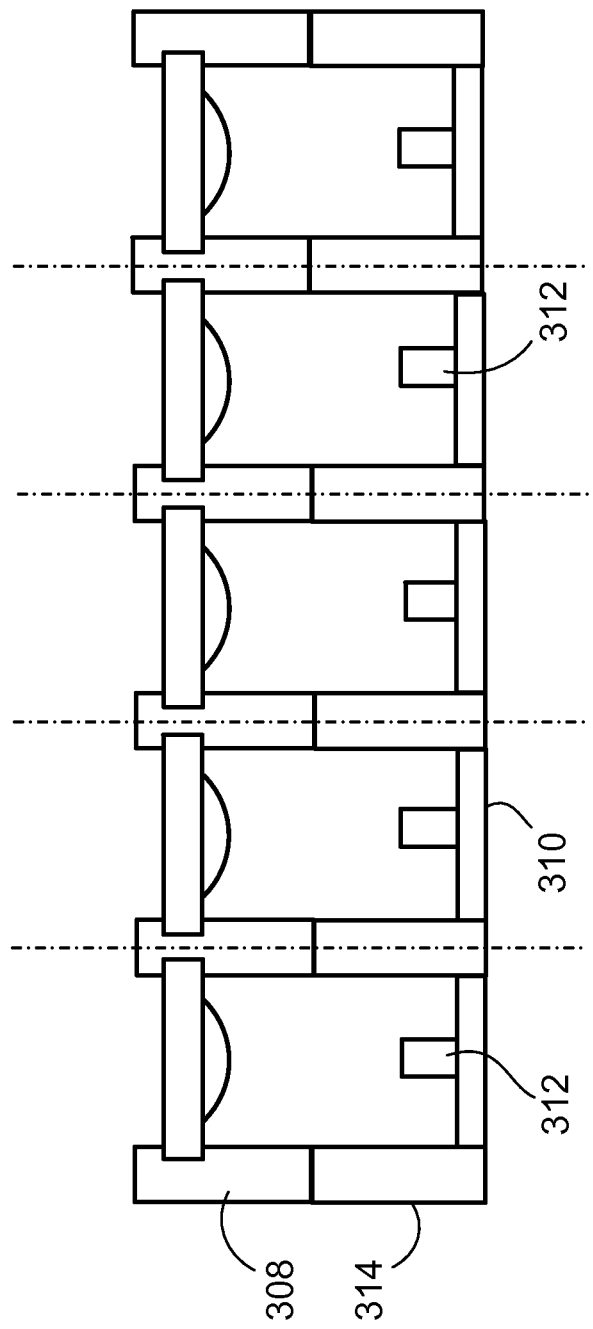

In modules fabricated using a stack as in FIG. 14C, one end of the spacer 308 is attached (e.g., by adhesive) to an end of the molded cavity 314. Thus, the molded cavity 314 is attached to the spacer 308, which may be composed, for example, of a vacuum injected polymer material such as epoxy, acrylate, polyurethane, or silicone containing a non-transparent filler such as carbon black, a pigment, or a dye. The sidewalls of the transparent cover 304 in each module can be encapsulated laterally by the same or similar material as the spacer 308; likewise, the sidewalls of the metal substrate 310 in each module can be encapsulated laterally by the molded cavity 314.

In the context of this disclosure, when reference is made to a particular material or component being transparent, it generally refers to the material or component being substantially transparent to light emitted by a light emitting element housed in the module or detectable by a light detecting element housed in the module. Likewise, when reference is made to a particular material or component being non-transparent, it generally refers to the material or component being substantially non-transparent to light emitted by a light emitting element housed in the module or detectable by a light detecting element housed in the module.

Various modifications can be made within the spirit of the invention. Accordingly, other implementations are within the scope of the claims.

What is claimed is:

1. A method of fabricating optoelectronic modules each of which includes at least one optoelectronic device and at least one an optical element, the method comprising:
providing a transparent wafer having first and second surfaces on opposite sides of the transparent wafer, wherein there are a plurality of non-transparent spacer elements on one of the surfaces of the transparent wafer;
forming openings in the transparent wafer, each opening disposed over a respective one of the spacer elements and extending through the transparent wafer; and
substantially filling the openings in the transparent wafer with a material that is non-transparent to light emitted by or detectable by the optoelectronic device.

2. The method of claim 1 further including:
attaching a substrate wafer to the spacer elements such that the spacer elements separate the substrate wafer from the transparent wafer, wherein there are a plurality of optoelectronic devices mounted on the substrate wafer, and wherein the substrate wafer and the transparent wafer form a wafer stack; and
separating the wafer stack into a plurality of individual modules, wherein each module includes at least one of the optoelectronic devices substantially aligned with a corresponding optical element that is on a portion of the transparent wafer that has sidewalls covered by the non-transparent material.

3. The method of claim 1 further including:
attaching singulated optoelectronic devices to the spacer elements such that the spacer elements separate the singulated optoelectronic devices from the transparent wafer, wherein the singulated optoelectronic devices and the transparent wafer form a vertical stack; and
separating the vertical stack into a plurality of individual modules, wherein each module includes at least one of the singulated optoelectronic devices substantially aligned with a corresponding optical element that is on a portion of the transparent wafer that has sidewalls covered by the non-transparent material.

4. The method of claim 1 wherein the optical elements are formed and the opening are filled using a single combined replication and vacuum injection tool.

5. The method of claim 1 wherein the openings are formed by dicing, micromachining or laser cutting.

6. The method of claim 1 wherein each of the openings extends partially into a respective one of the spacers elements.

7. The method of claim 1 wherein providing a transparent wafer includes providing a transparent wafer having optical elements on at least one of the first or second surfaces.

8. The method of claim 1 wherein providing a transparent wafer includes providing a transparent wafer having optical elements on the same surface of the transparent wafer as the spacer elements.

9. The method of claim 1 further including partially covering the first surface of the transparent wafer with the same non-transparent material that fills the openings in the transparent wafer, wherein the first surface is on the opposite side of the transparent wafer from the surface on which the spacer elements are disposed,
and wherein when the wafer stack is separated into individual modules, each module includes a baffle composed of the non-transparent material.

10. The method of claim 1 further including attaching a baffle wafer over the filled-in openings in the transparent wafer, the baffle wafer being composed of material that is non-transparent to light emitted by or detectable by the optoelectronic device.

11. The method of claim 1 wherein the spacer elements are composed of the same non-transparent material as the material that fills the openings in the transparent wafer.

12. The method of claim 1 including forming optical elements on the opposite surface of the transparent wafer from the surface on which the spacer elements are disposed, wherein a single replication and vacuum injection tool is used to form the optical elements and to fill the openings in the transparent wafer with a non-transparent material.

13. The method of claim 1 wherein there is at least one of a focal length correction layer or an optical filter on a surface of the transparent wafer, the method further including:
attaching one or more optics assemblies over an object-side of the transparent wafer, wherein the one or more optics assemblies include lens stacks.

14. The method of claim 1 wherein the openings are filled with a non-transparent material using a vacuum injection tool.

15. The method of claim 14 further including causing the non-transparent material to harden.

16. The method of claim 1 further including forming optical elements on the opposite surface of the transparent wafer from the surface on which the spacer elements are disposed.

17. The method of claim 16 wherein the optical elements are formed by an embossing-type replication technique.

18. A method of fabricating optoelectronic modules each of which includes at least one optoelectronic device and at least one optical element, the method comprising:
providing a transparent wafer having first and second surfaces on opposite sides of the transparent wafer, wherein there are a plurality of non-transparent spacer elements on one of the surfaces of the transparent wafer;
forming openings in the transparent wafer, each opening disposed over a respective one of the spacer elements and extending through the transparent wafer; and
providing a material that is non-transparent to light emitted by or detectable by the optoelectronic devices in the openings of the transparent wafer so as to cover sidewalls of portions of the transparent wafer.

* * * * *